US012142577B2

(12) United States Patent
Huesgen et al.

(10) Patent No.: US 12,142,577 B2
(45) Date of Patent: Nov. 12, 2024

(54) PACKAGE COMPRISING METAL LAYER CONFIGURED FOR ELECTROMAGNETIC INTERFERENCE SHIELD AND HEAT DISSIPATION

(71) Applicants: QUALCOMM Technologies Inc., San Diego, CA (US); RF360 Europe GmbH, Munich (DE)

(72) Inventors: Marc Huesgen, Singapore (SG); Philipp Michael Jaeger, Munich (DE)

(73) Assignees: QUALCOMM Technologies, Inc., San Diego, CA (US); RF360 Europe GmbH, Munich (DE)

( * ) Notice: Subject to any disclaimer, the term of this patent is extended or adjusted under 35 U.S.C. 154(b) by 206 days.

(21) Appl. No.: 17/191,550

(22) Filed: Mar. 3, 2021

(65) Prior Publication Data

US 2022/0285286 A1    Sep. 8, 2022

(51) Int. Cl.
| | | |
|---|---|---|
| *H01L 23/552* | (2006.01) | |
| *H01L 21/48* | (2006.01) | |
| *H01L 21/56* | (2006.01) | |
| *H01L 21/768* | (2006.01) | |
| *H01L 23/367* | (2006.01) | |
| *H01L 23/373* | (2006.01) | |
| *H01L 23/48* | (2006.01) | |
| *H01L 23/49* | (2006.01) | |

(52) U.S. Cl.
CPC ........ *H01L 23/552* (2013.01); *H01L 21/4885* (2013.01); *H01L 21/565* (2013.01); *H01L 21/76898* (2013.01); *H01L 23/3677* (2013.01); *H01L 23/3736* (2013.01); *H01L 23/481* (2013.01); *H01L 23/49* (2013.01)

(58) Field of Classification Search
CPC . H01L 23/552; H01L 21/4885; H01L 21/565; H01L 21/76898; H01L 23/3677; H01L 23/3736; H01L 23/481; H01L 23/49; H01L 2924/3025; H01L 2924/15192
USPC .......................................................... 257/659
See application file for complete search history.

(56) References Cited

U.S. PATENT DOCUMENTS

| | | | |
|---|---|---|---|
| 9,660,584 B2 | 5/2017 | Modi et al. | |
| 10,872,879 B2 | 12/2020 | Kim et al. | |
| 2014/0293550 A1* | 10/2014 | Mugiya | ................. H01L 23/552 361/728 |
| 2017/0040304 A1* | 2/2017 | Shih | ...................... H01L 23/552 |
| 2017/0263569 A1* | 9/2017 | Sommer | ............. H01L 25/0652 |

(Continued)

OTHER PUBLICATIONS

International Search Report and Written Opinion—PCT/US2022/015521—ISA/EPO—Sep. 27, 2022.

(Continued)

*Primary Examiner* — Didarul A Mazumder
(74) *Attorney, Agent, or Firm* — Loza & Loza, LLP

(57) ABSTRACT

A package that includes a substrate, an integrated device coupled to the substrate, an encapsulation layer located over the substrate, at least one encapsulation layer interconnect located in the encapsulation layer, and a metal layer located over the encapsulation layer. The substrate includes at least one dielectric layer and a plurality of interconnects. The encapsulation layer interconnect is coupled to the substrate. The metal layer is configured as an electromagnetic interference (EMI) shield for the package. The metal layer is located over a backside of the integrated device.

36 Claims, 20 Drawing Sheets

SIDE PROFILE VIEW

(56) References Cited

U.S. PATENT DOCUMENTS

| | | | | |
|---|---|---|---|---|
| 2018/0053735 A1* | 2/2018 | Ueda | ................ | H01Q 21/08 |
| 2018/0096967 A1 | 4/2018 | Tsai et al. | | |
| 2018/0098418 A1* | 4/2018 | Lee | ................ | H05K 1/111 |
| 2018/0374798 A1* | 12/2018 | Lee | ................ | H01L 23/552 |
| 2019/0348372 A1* | 11/2019 | Jun | ................ | H01L 25/50 |
| 2020/0098698 A1 | 3/2020 | Patten et al. | | |
| 2020/0168558 A1* | 5/2020 | Seo | ................ | H01L 24/20 |
| 2021/0160999 A1* | 5/2021 | Dogiamis | ................ | H05K 9/0037 |
| 2021/0375707 A1 | 12/2021 | Teixeira De Queiros et al. | | |
| 2022/0013452 A1* | 1/2022 | Kim | ................ | H01L 21/565 |

OTHER PUBLICATIONS

Partial International Search Report—PCT/US2022/015521—ISA/EPO—Aug. 4, 2022.

* cited by examiner

SIDE PROFILE VIEW

SIDE PROFILE VIEW

SIDE PROFILE VIEW

SIDE PROFILE VIEW

SIDE PROFILE VIEW

SIDE PROFILE VIEW

SIDE PROFILE VIEW

SIDE PROFILE VIEW

SIDE PROFILE VIEW

PLAN VIEW

PACKAGE COMPRISING METAL LAYER CONFIGURED FOR ELECTROMAGNETIC INTERFERENCE SHIELD AND HEAT DISSIPATION

FIELD

Various features relate to packages that include an integrated device and substrate.

BACKGROUND

FIG. 1 illustrates a package 100 that includes a substrate 102, an integrated device 104, and an integrated device 106. The substrate 102 includes at least one dielectric layer 120, a plurality of interconnects 122, and a plurality of solder interconnects 124. A plurality of solder interconnects 144 is coupled to the substrate 102 and the integrated device 104. A plurality of solder interconnects 164 is coupled to the substrate 102 and the integrated device 106. When the integrated devices 104 and 106 are operating, the integrated devices 104 and 106 generate heat. The build-up of heat can affect the performance of the integrated devices 104 and 106. As such, there is an ongoing need to provide a package that can properly and adequately dissipate heat from the integrated devices.

SUMMARY

Various features relate to packages that include an integrated device and substrate.

One example provides a package that includes a substrate, an integrated device coupled to the substrate, an encapsulation layer located over the substrate, at least one encapsulation layer interconnect located in the encapsulation layer, and at least one metal layer located over the encapsulation layer. The substrate includes at least one dielectric layer and a plurality of interconnects. The encapsulation layer interconnect is coupled to the substrate. The at least one metal layer is configured as an electromagnetic interference (EMI) shield for the package. The at least one metal layer is located over a backside of the integrated device.

Another example provides an apparatus that includes a substrate, an integrated device coupled to the substrate, means for encapsulation located over the substrate, means for encapsulation layer interconnection located in the means for encapsulation, and means for electromagnetic interference (EMI) shield located over the encapsulation layer. The substrate includes at least one dielectric layer and a plurality of interconnects. The means for encapsulation layer interconnection is coupled to the substrate. The means for EMI shield is located over a backside of the integrated device.

Another example provides a package that includes a substrate, an integrated device coupled to the substrate, an encapsulation layer located over the substrate, at least one encapsulation layer interconnect located in the encapsulation layer, wherein the encapsulation layer interconnect is coupled to the substrate; and at least one thermal dielectric layer located over the encapsulation layer, wherein the at least one thermal dielectric layer is located over a backside of the integrated device. The substrate includes at least one dielectric layer; and a plurality of interconnects.

Another example provides a method for fabricating a package. The method provides a substrate comprising at least one dielectric layer and a plurality of interconnects. The method couples an integrated device to the substrate. The method forms an encapsulation layer located over the substrate. The method forms at least one encapsulation layer interconnect located in the encapsulation layer, where the at least one encapsulation layer interconnect is coupled to the substrate. The method forms at least one metal layer over the encapsulation layer. The at least one metal layer is configured as an electromagnetic interference (EMI) shield for the package. The at least one metal layer is located over a backside of the integrated device.

Another example provides a package that includes a substrate, an integrated device coupled to the substrate, an encapsulation layer located over the substrate, at least one encapsulation layer interconnect located in the encapsulation layer, and at least one dielectricum layer located over the encapsulation layer. The substrate includes at least one dielectric layer and a plurality of interconnects. The encapsulation layer interconnect is coupled to the substrate. The at least one dielectricum layer is configured as a thermal management layer for the package. The at least one dielectricum layer is located over a backside of the integrated device.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, an integrated device coupled to the substrate, an encapsulation layer located over the substrate, at least one encapsulation layer interconnect located in the encapsulation layer, and at least one metal layer located over the encapsulation layer. The substrate includes at least one dielectric layer and a plurality of interconnects. The encapsulation layer interconnect is coupled to the substrate. The package may also include at least one thermal dielectric layer located between the at least one metal layer and the integrated device. The at least one metal layer is configured as an electromagnetic interference (EMI) shield for the package. The at least one metal layer is located over a backside of the integrated device. The at least one metal layer is coupled to ground. The integrated device generates heat as an undesired by-product under normal operation. In some implementations, a majority of the heat that is generated by the integrated device is dissipated by heat conduction through (i) the backside of the integrated device, and (ii) the at least one metal layer, (iii) the at least one encapsulation layer interconnect, and (iv) the plurality of interconnects of the substrate. Thus, the package described in the disclosure describes a configuration that helps protect the package from EMI and helps reduce and dissipate heat that may be generated by the integrated device, which in turn, helps keep the integrated device and the package operating optimally.

Figure 1:
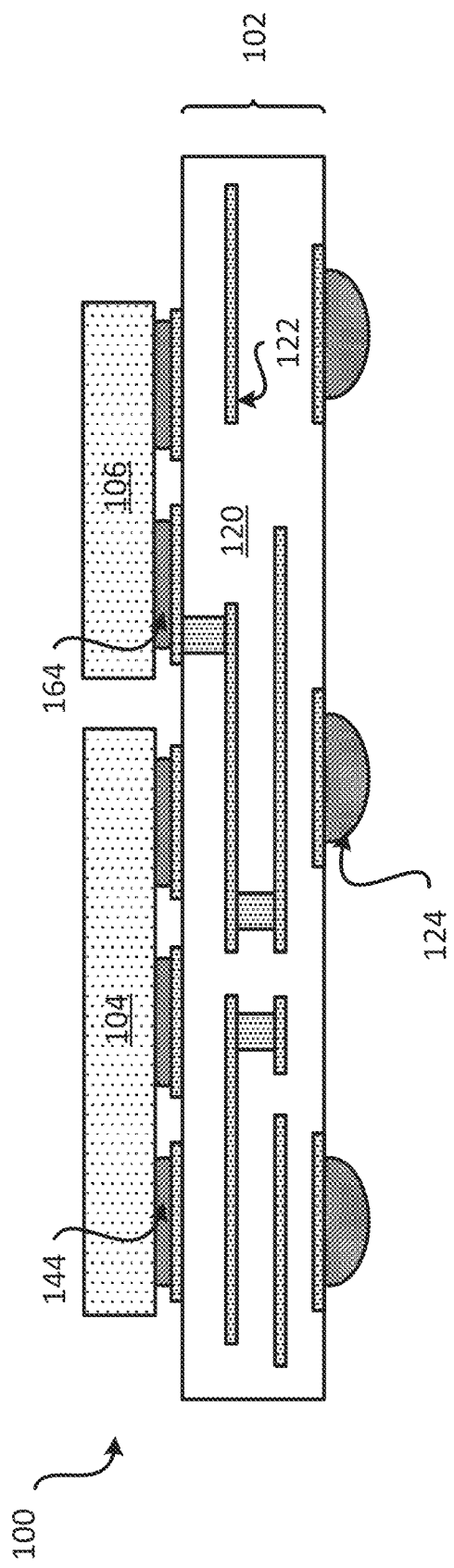
FIG. 1 illustrates a profile view of a package that includes a substrate and integrated devices.
Figure 2:
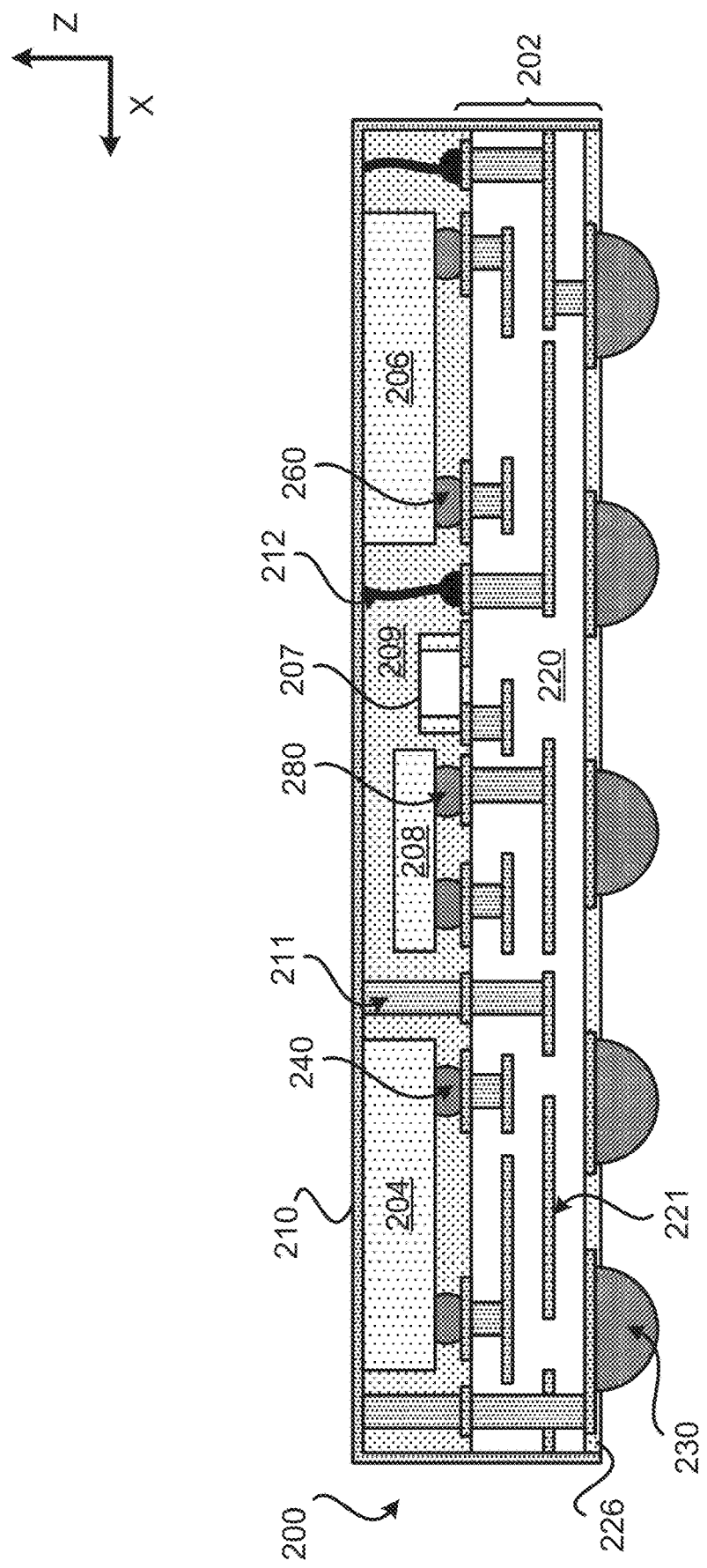
FIG. 2 illustrates a profile view of a package that includes a substrate, an integrated device, an encapsulation layer and a metal layer configured as an electromagnetic interference (EMI) shield.

Exemplary Package Comprising a Substrate, an Integrated Device and a Metal Layer Configured for Electromagnetic Interference (EMI) Shield and Heat Dissipation FIG. 2 illustrates a profile view of a package 200 that includes a substrate 202, an integrated device 204, an integrated device 206, an integrated device 208, a passive component 207, an encapsulation layer 209, and a metal layer 210. In some implementations, the package 200 may be an integrated circuit (IC) package, such as a system in package (SiP) or a chip scale package (CSP). In some implementations, the package 200 may be configured as a radio frequency front end (RFFE) package that includes a radio frequency (RF) filter.

The substrate 202 includes at least one dielectric layer 220 and a plurality of interconnects 221 (e.g., substrate interconnects). The substrate 202 may also include a solder resist layer 226 located over a bottom portion of the substrate 202. A plurality of solder interconnects 230 is coupled to the bottom portion of the substrate 202. The plurality of solder interconnects 230 may be coupled to the plurality of interconnects 221. Different implementations may include different types of substrates. The substrate 202 may include a cored substrate, a coreless substrate, a ceramic substrate and/or a laminated substrate.

The integrated device 204, the integrated device 206, the integrated device 208 and the passive component 207 (e.g., discrete capacitor) are coupled to a first surface (e.g., top surface) of the substrate 202. The integrated device 204 is coupled to the plurality of interconnects 221 of the substrate 202 through a plurality of solder interconnects 240. The integrated device 206 is coupled to the plurality of interconnects 221 of the substrate 202 through a plurality of solder interconnects 260. The integrated device 208 is coupled to the plurality of interconnects 221 of the substrate 202 through a plurality of solder interconnects 280. The passive component 207 is coupled to the plurality of interconnects 221 of the substrate 202. In some implementations, a plurality of pillar interconnects and solder interconnects may be used to couple the integrated device(s) (e.g., 204, 206, 208) to the plurality of interconnects 221.

The package 200 also includes a plurality of through mold vias (TMVs) 211 and a plurality of wire bonds 212. The plurality of TMVs 211 and/or the plurality of wire bonds 212 are examples of a plurality of encapsulation layer interconnects (e.g., means for encapsulation layer interconnection). The plurality of TMVs 211 is coupled to the substrate 202. In particular, the plurality of TMVs 211 is coupled to the plurality of interconnects 221. Similarly, the plurality of wire bonds 212 is coupled to the substrate 202. In particular, the plurality of wire bonds 212 is coupled to the plurality of interconnects 221. The plurality of through mold vias 211 (TMVs) and the plurality of wire bonds 212 are located (e.g., embedded) in the encapsulation layer 209. The plurality of through mold vias 211 (TMVs) and the plurality of wire bonds 212 may be at least partially encapsulated by the encapsulation layer 209. The plurality of through mold vias 211 (TMVs) and/or the plurality of wire bonds 212 are located laterally to the integrated device(s) (e.g., 204, 206, 208) and the passive component 207.

As will be further described below, the plurality of through mold vias 211 (TMVs) and/or the plurality of wire bonds 212 may be located laterally around one or more integrated devices, such as to form a fence or boundary around one or more integrated devices. At least one encapsulation layer interconnect (e.g., TMVs 211, wire bonds 212) is configured as at least one compartmental EMI shield for the package 200. The plurality of through mold vias 211 (TMVs) and/or the plurality of wire bonds 212 are configured to be coupled to ground. The plurality of through mold vias 211 (TMVs) and/or the plurality of wire bonds 212 are configured to operate as a conformal EMI shield for the package 200. Moreover, as will be further described below, the plurality of through mold vias 211 (TMVs) and/or the plurality of wire bonds 212 are configured to help dissipate heat (e.g., help dissipate heat away from one or more integrated devices).

The encapsulation layer 209 is located over a first surface of the substrate 202. The encapsulation layer 209 may at least partially encapsulate the integrated devices (e.g., 204, 206, 208), the passive component 207, the plurality of through mold vias 211 (TMVs) and/or the plurality of wire bonds 212. The encapsulation layer 209 may encapsulate at least one encapsulation layer interconnect (e.g., TMV 211, wire bond 212). The encapsulation layer 209 may include a mold, a resin and/or an epoxy. A compression molding process, a transfer molding process, or a liquid molding process may be used to form the encapsulation layer 209. The encapsulation layer 209 may be photo etchable. The encapsulation layer 209 may be a means for encapsulation.

The metal layer 210 is located over a top surface of the encapsulation layer 209 and/or a backside of the integrated devices 204 and 206. The metal layer 210 is coupled to the encapsulation layer 209 and the backsides of the integrated devices 204 and 206. Moreover, the metal layer 210 is coupled to the plurality of TMVs 211 and the plurality of wire bonds 212. Thus, the metal layer 210 is coupled to at least one encapsulation layer interconnect. The metal layer 210 is located over a side surface of the package 200. For example, the metal layer 210 is located and/or coupled to a side surface of the encapsulation layer 209 and/or a side surface of the substrate 202. The metal layer 210 may include one or more metal layers.

The metal layer 210 is configured to operate as an electromagnetic interference (EMI) shield (e.g., means for EMI shield, conformal EMI shield, means for conformal EMI shield) for the package 200. The metal layer 210 is configured to be coupled to ground. The metal layer 210 is also configured to dissipate heat by conduction from one or more integrated devices (e.g., 204, 206).

Different implementations may use different materials for the metal layer 210. For example, the metal layer 210 may include copper. In some implementations, the metal layer 210 may be replaced with at least one dielectricum layer (e.g., one or more dielectricum layers). The dielectricum layer may replace any of the other metal layers (e.g., 410) described in the disclosure. The at least one dielectricum layer may perform the same function as described for the metal layer (e.g., 210, 410). At least one dielectricum layer may be configured as a thermal management layer for a package. A means for electromagnetic interference (EMI) shield may include at least one dielectricum layer.

The integrated devices (e.g., 204, 206) are configured to generate heat. Heat build-up in the integrated devices can lead to sub-optimal integrated devices performance and/or integrated device failure. Thus, it is important to be able to reduce and dissipate heat from the integrated devices. The design and configuration of the package 200 is such that the metal layer 210, the plurality of TMVs 211, the plurality of wire bonds 212, and/or the plurality of interconnects 221 may provide thermal paths for heat to efficiently and effectively dissipate from the integrated devices. In some implementations, a majority of the heat that is generated (e.g., individually and/or collectively) by the integrated device(s) (e.g., 204, 206) is dissipated by heat conduction through (i) the backside of the integrated device (e.g., 204, 206), (ii) the metal layer 210, (iii) the at least one encapsulation layer interconnect (e.g., TMV 211, wire bond 212), and/or (iv) the plurality of interconnects 221 of the substrate 202. In some implementations, at least twenty percent (20%) of the heat that is generated (e.g., individually and/or collectively) by the integrated device(s) (e.g., 204, 206) is dissipated by heat conduction through (i) the backside of the integrated device (e.g., 204, 206), (ii) the metal layer 210, (iii) the at least one encapsulation layer interconnect (e.g., TMV 211, wire bond 212), and/or (iv) the plurality of interconnects 221 of the substrate 202. Examples heat paths and/or heat flux in a package are further illustrated and described below in at least FIGS. 9 and 10 below.

An integrated device (e.g., 204, 206, 208) may include a die (e.g., semiconductor bare die). The integrated device may include a radio frequency (RF) device, a passive device, a filter, a capacitor, an inductor, a resistor, an antenna, a transmitter, a receiver, a surface acoustic wave (SAW) filter, a bulk acoustic wave (BAW) filter, a light emitting diode (LED) integrated device, a silicon carbide (SiC) based integrated device, a GaAs based integrated device, a GaN based integrated device, a processor, memory, a power amplifier, a switch, a system on chip, an integrated circuit device, a micro-electromechanical systems (MEMS) device, a nano-electromechanical systems (NEMS) device and/or combinations thereof. An integrated device (e.g., 204, 206, 208) may include at least one electronic circuit (e.g., first electronic circuit, second electronic circuit, etc. . . . ).

For example, when the integrated device (e.g., 204, 206, 208) is configured as a semiconductor integrated circuit die, the integrated device may include a substrate and a device layer that includes transistors configured to perform operations (e.g., logic operations). In another example, when the integrated device (e.g., 204, 206, 208) is configured as a bare die filter (e.g., SAW filter, BAW filter), the integrated device may include a piezoelectric substrate and at least one metal layer formed and located over the piezoelectric substrate, that is configured as at least one transducer (e.g., interdigital transducer (IDT)).

Figure 3:
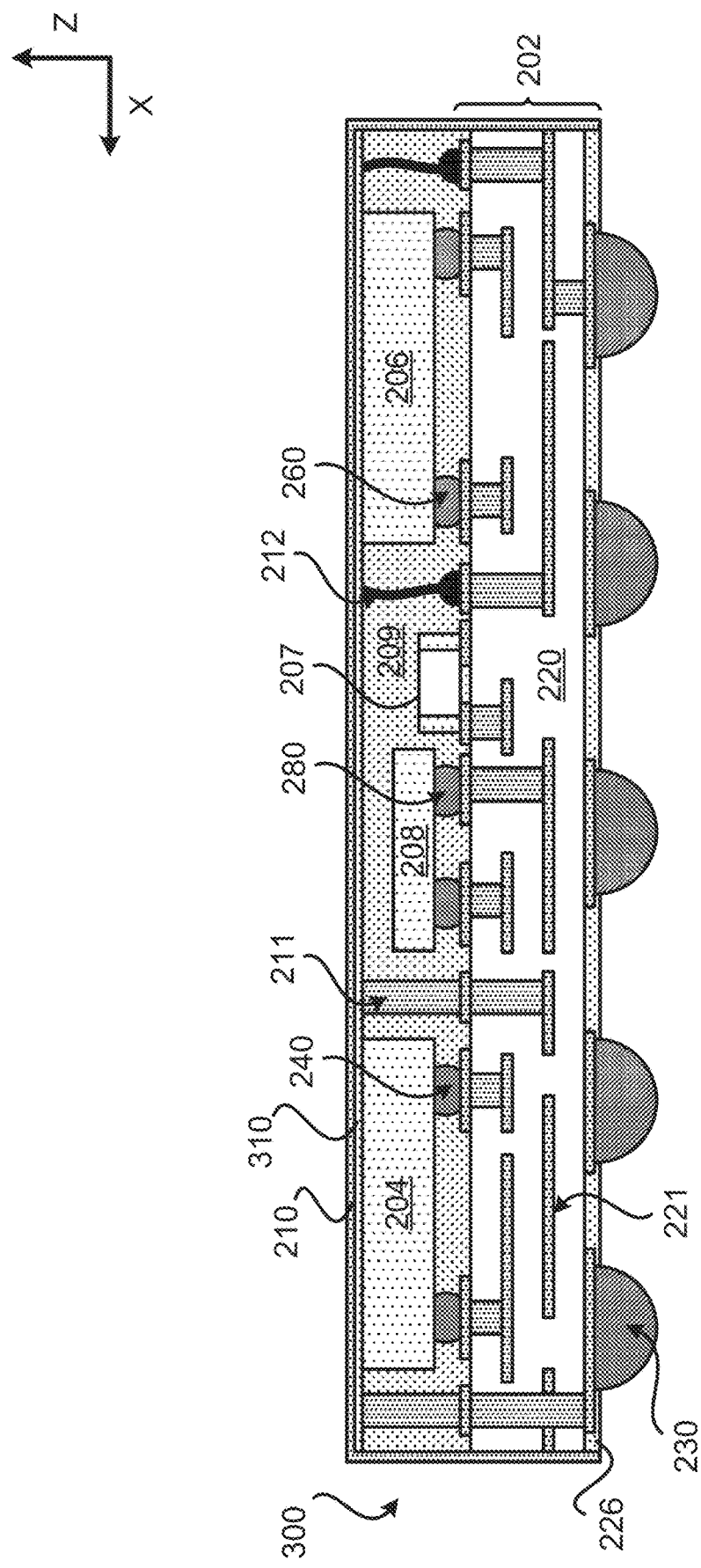
FIG. 3 illustrates a profile view of another package that includes a substrate, an integrated device, an encapsulation layer, a thermal dielectric layer and a metal layer configured as an EMI shield.

FIG. 3 illustrates a package 300 that includes a metal layer configured for an EMI shield and heat dissipation. The package 300 is similar to the package 200 and includes the same or similar components as the package 200 of FIG. 2. The package 300 is configured in a similar manner as described for the package 200. The package 300 also includes a thermal dielectric layer 310. The thermal dielectric layer 310 is located over the encapsulation layer 209 and the integrated devices 204 and 206. The thermal dielectric layer 310 is located between the encapsulation layer 209 and the metal layer 210. The thermal dielectric layer 310 is also located between the integrated devices 204 and 206, and the metal layer 210. The thermal dielectric layer 310 is coupled to a top surface of the encapsulation layer 209, a backside of the integrated device 204 (e.g., first integrated device), a backside of the integrated device 206 (e.g., second integrated device), the plurality of TMVs 211 and the plurality of wire bonds 212.

The thermal dielectric layer 310 is a dielectric layer that is configured to not electrically conduct a current, but is configured to efficiently conduct thermal energy. The thermal dielectric layer 310 is a poor conductor of electricity but a good or above average conductor of heat. The thermal dielectric layer 310 helps improve the performance of the package by reducing the electro-magnetic coupling towards ground. In some implementations, the thermal dielectric layer 310 has a dielectric constant (k) that is less than 40. In some implementations, the thermal dielectric layer 310 has a dielectric constant (k) that is less than 15. In some implementations, the thermal dielectric layer 310 has a dielectric constant (k) that is less than 10. The thermal dielectric layer 310 may have a thermal conductivity that is higher than the thermal conductivity of the encapsulation layer 209. The thermal dielectric layer 310 may have a thermal conductivity that is higher than the thermal conductivity of the substrate of the integrated device (e.g., 204, 206). Examples of substrates for an integrated device, include $LiTaO_3$ (which has a thermal conductivity of about 6.69 W/(m·k), $LiNbO_3$ (which has a thermal conductivity of about 4.19 W/(m·k), and silicon (Si) (which has a thermal conductivity of about 150 W/(m·k). The thermal dielectric layer 310 may have a thermal conductivity that is greater than 4 W/(m·k). The thermal dielectric layer 310 may include refractory carbides, nitrides and borides, and/or combinations thereof (e.g., carbo-nitrides). The thermal dielectric layer 310 may include oxides, such as $Al_2O_3$ (which has a thermal conductivity of approximately 30 W/(m·k). The thermal dielectric layer 310 may include AlN, which has a thermal conductivity of approximately 200 W/(m·k). It is noted that the thermal dielectric layer 310 may include one or more thermal dielectric layers. A dielectricum layer may have similar properties as the thermal dielectric layer 310.

The design and configuration of the package 300 is such that the metal layer 210, the thermal dielectric layer 310, the plurality of TMVs 211, the plurality of wire bonds 212, and/or the plurality of interconnects 221 may provide thermal paths for heat to efficiently and effectively dissipate from the integrated devices. In some implementations, a majority of the heat that is generated (e.g., individually and/or collectively) by the integrated device(s) (e.g., 204, 206) is dissipated by heat conduction through (i) the backside of the integrated device (e.g., 204, 206), (ii) the thermal dielectric layer 310, (iii) the metal layer 210, (iv) the at least one encapsulation layer interconnect (e.g., TMV 211, wire bond 212), and/or (v) the plurality of interconnects 221 of the substrate 202. In some implementations, at least twenty percent (20%) of the heat that is generated (e.g., individually and/or collectively) by the integrated device(s) (e.g., 204, 206) is dissipated by heat conduction through (i) the backside of the integrated device (e.g., 204, 206), (ii) the thermal dielectric layer 310, (iii) the metal layer 210, (iv) the at least one encapsulation layer interconnect (e.g., TMV 211, wire bond 212), and/or (v) the plurality of interconnects 221 of the substrate 202. Examples heat paths and/or heat flux in a package are further illustrated and described below in at least FIGS. 9 and 10 below.

Figure 4:
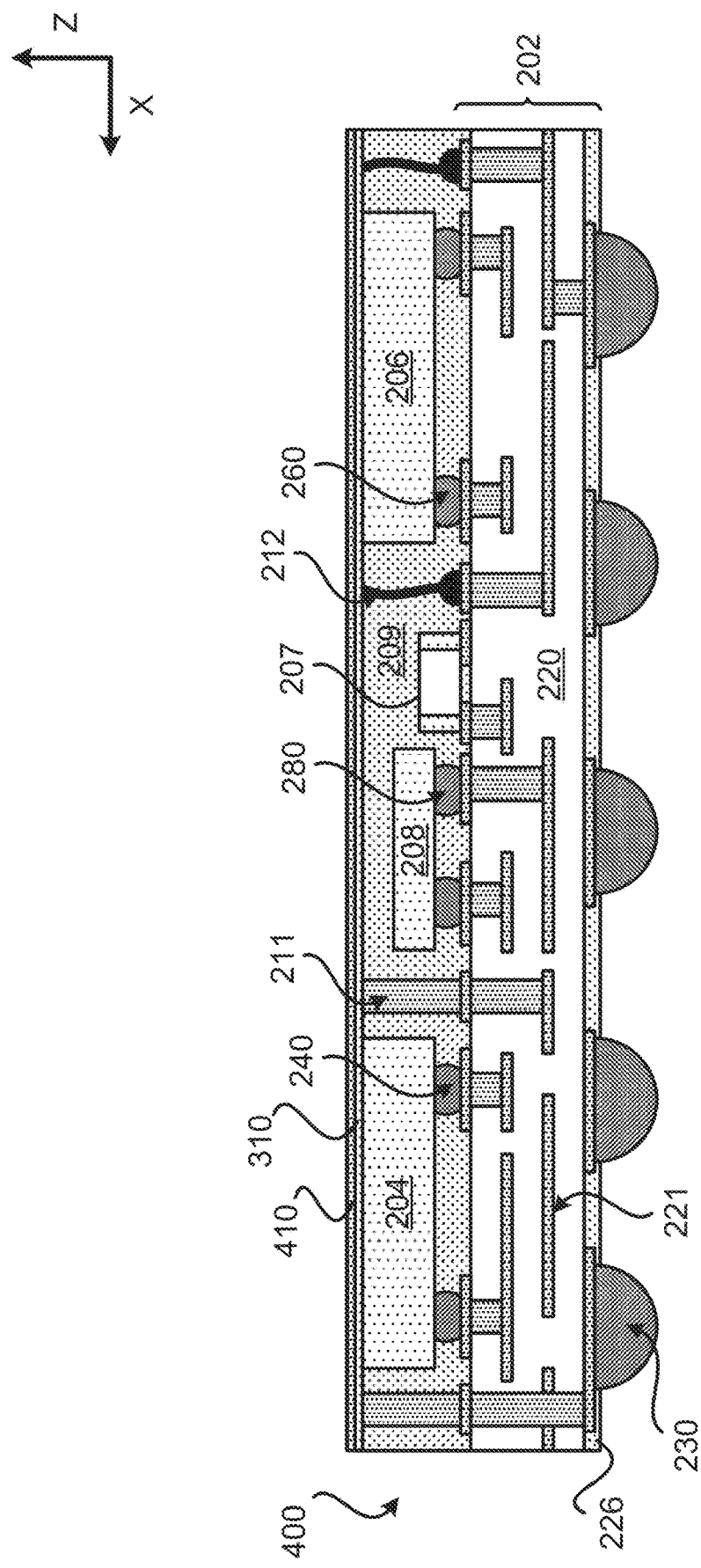
FIG. 4 illustrates a profile view of another package that includes a substrate, an integrated device, an encapsulation layer, a thermal dielectric layer and a metal layer configured as an EMI shield.

FIG. 4 illustrates a package 400 that includes a metal layer configured for an EMI shield and heat dissipation. The package 400 is similar to the package 300 and includes the same or similar components as the package 300 of FIG. 3. The package 400 is configured in a similar manner as described for the package 300. In FIG. 4, the package 400 includes a metal layer 410 that is not located over the side surface of encapsulation layer 209 and the side surface of the substrate 202. As shown in FIG. 4, the metal layer 410 is located over a top surface of the encapsulation layer 209 and the thermal dielectric layer 310. The metal layer 410 is similar to the metal layer 210, as described in FIGS. 2 and 3.

Figure 5:
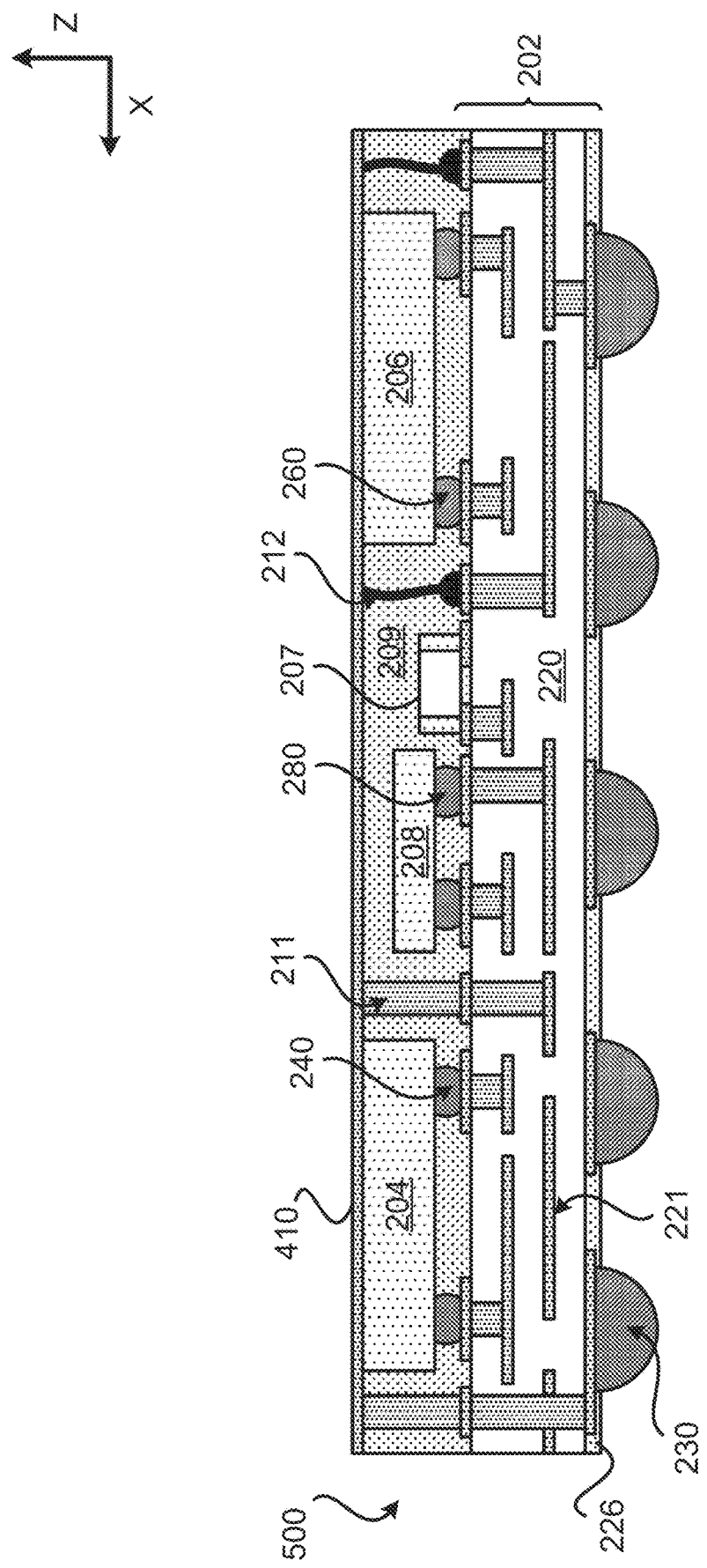
FIG. 5 illustrates a profile view of another package that includes a substrate, an integrated device, an encapsulation layer, and a metal layer configured as an EMI shield.

FIG. 5 illustrates a package 500 that includes a metal layer configured for an EMI shield and heat dissipation. The package 500 is similar to the package 200 and includes the same or similar components as the package 200 of FIG. 2. The package 500 is configured in a similar manner as described for the package 200. In FIG. 5, the package 500 includes a metal layer 410 that is not located over the side surface of encapsulation layer 209 and the side surface of the substrate 202. As shown in FIG. 5, the metal layer 410 is located over a top surface of the encapsulation layer 209. The metal layer 410 is similar to the metal layer 210, as described in FIG. 2.

Figure 6:
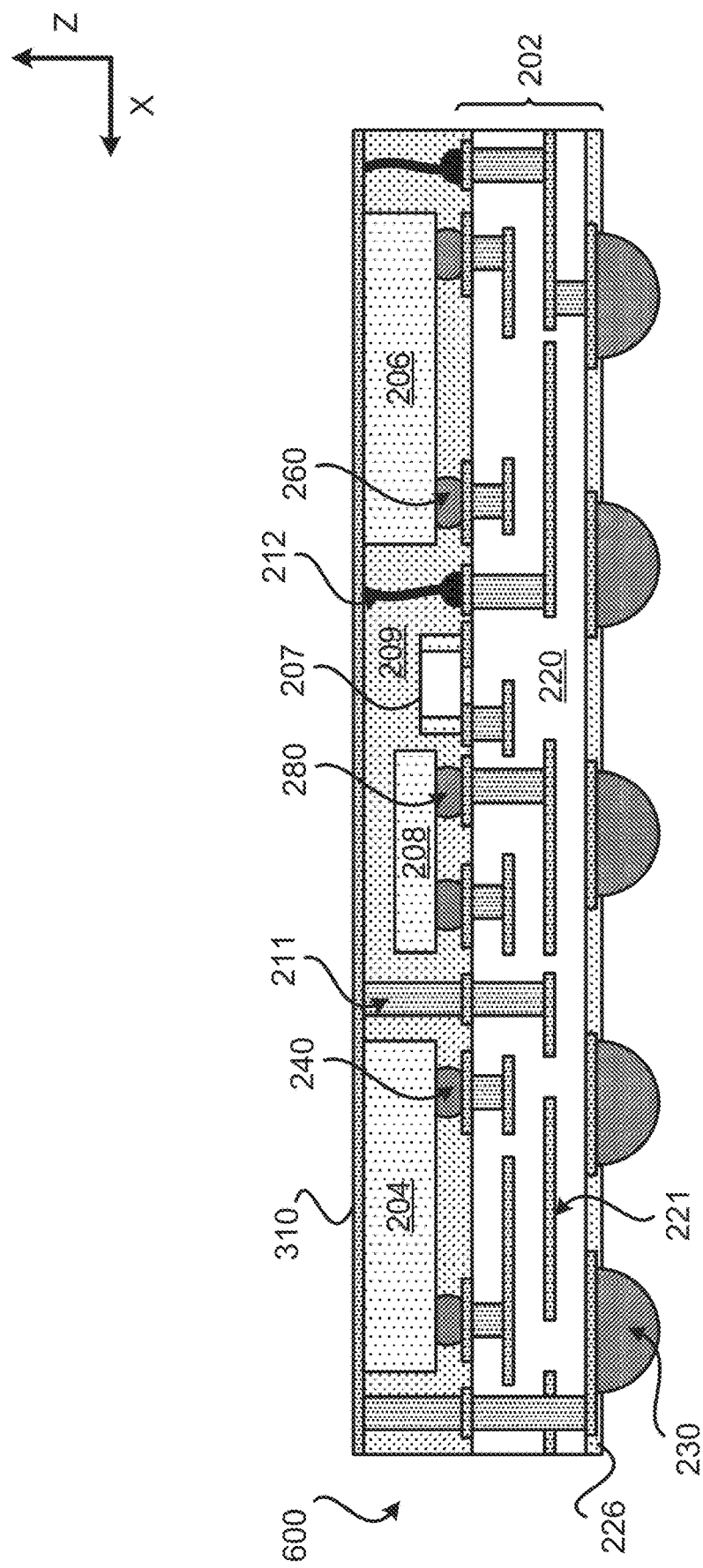
FIG. 6 illustrates a profile view of another package that includes a substrate, an integrated device, an encapsulation layer, and a thermal dielectric layer.

FIG. 6 illustrates a package 600 that includes a thermal dielectric layer. The package 600 is similar to the package 300 and includes the same or similar components as the package 300 of FIG. 3. The package 600 is configured in a similar manner as described for the package 300. In FIG. 6, the package 600 includes the thermal dielectric layer 310. However, there is no metal layer on top of the thermal dielectric layer 310. This configuration helps limit the impact of ground, which helps improve the performance of the package 600.

Figure 7:
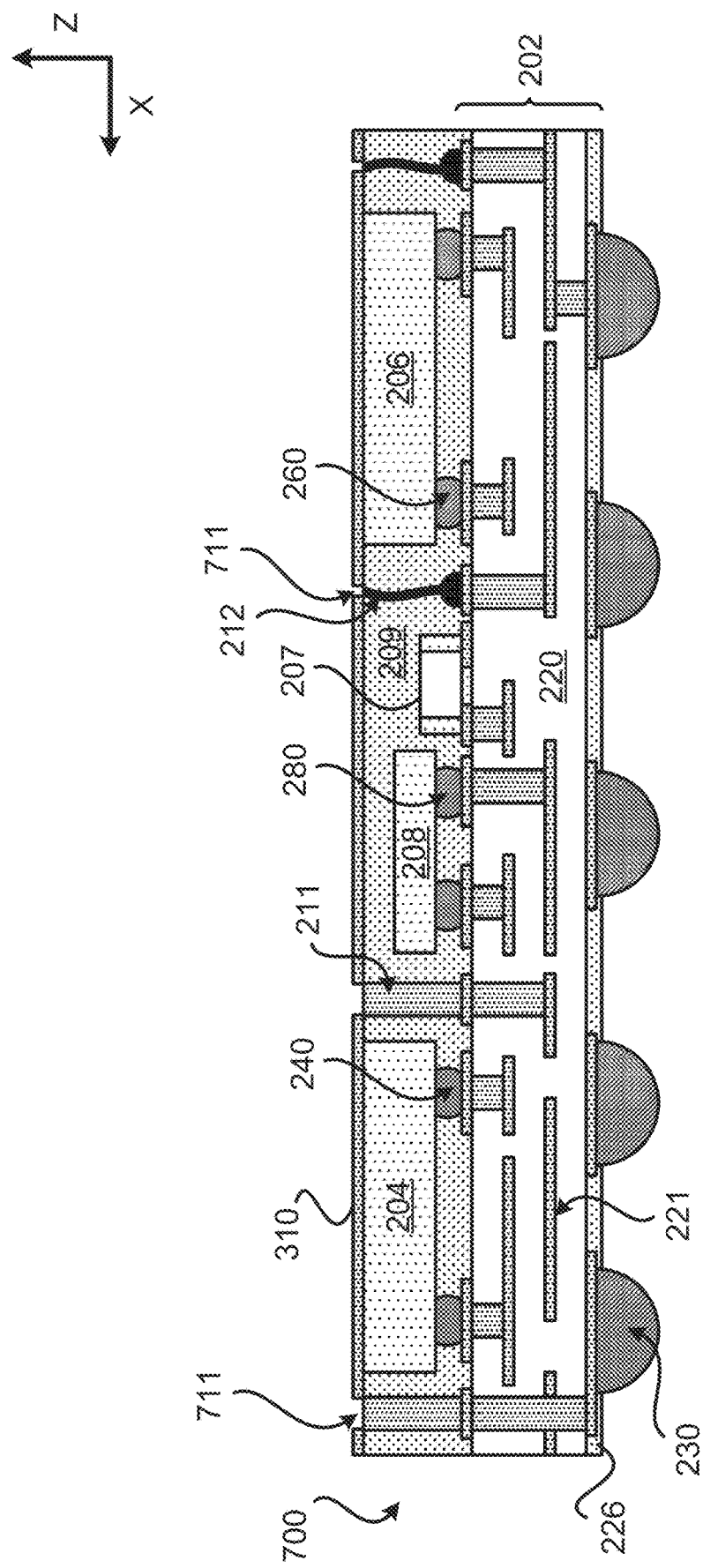
FIG. 7 illustrates a profile view of another package that includes a substrate, an integrated device, an encapsulation layer, and a thermal dielectric layer.

FIG. 7 illustrates a package 700 that includes a thermal dielectric layer. The package 700 is similar to the package 600 and includes the same or similar components as the package 600 of FIG. 6. The package 700 is configured in a similar manner as described for the packages 300 and 600. In FIG. 7, portions of the thermal dielectric layer 310 that are located over the TMVs 211 and/or the wire bonds 212 have been removed, creating at least one trench 711 in the thermal dielectric layer 310. A laser process (e.g., laser ablation) may be used to remove portions of the thermal dielectric layer 310. The removal of portions of the thermal dielectric layer 310 is not limited to the package 700. The trench 711 in the thermal dielectric layer 310 may be implemented in any of the packages described in the disclosure that includes a thermal dielectric layer 310.

The disclosure describes TMVs and/or wire bonds located in the encapsulation layer, that are configured for EMI shielding. However, in some implementations, other types of materials and/or structures may be used for EMI shielding. For example, the TMVs and/or wire bonds may be replaced and/or used in conjunction with pre-built metallized frames, pre-built metallized walls, metal cans, and/or surface mounted devices (SMD).

Figure 8:
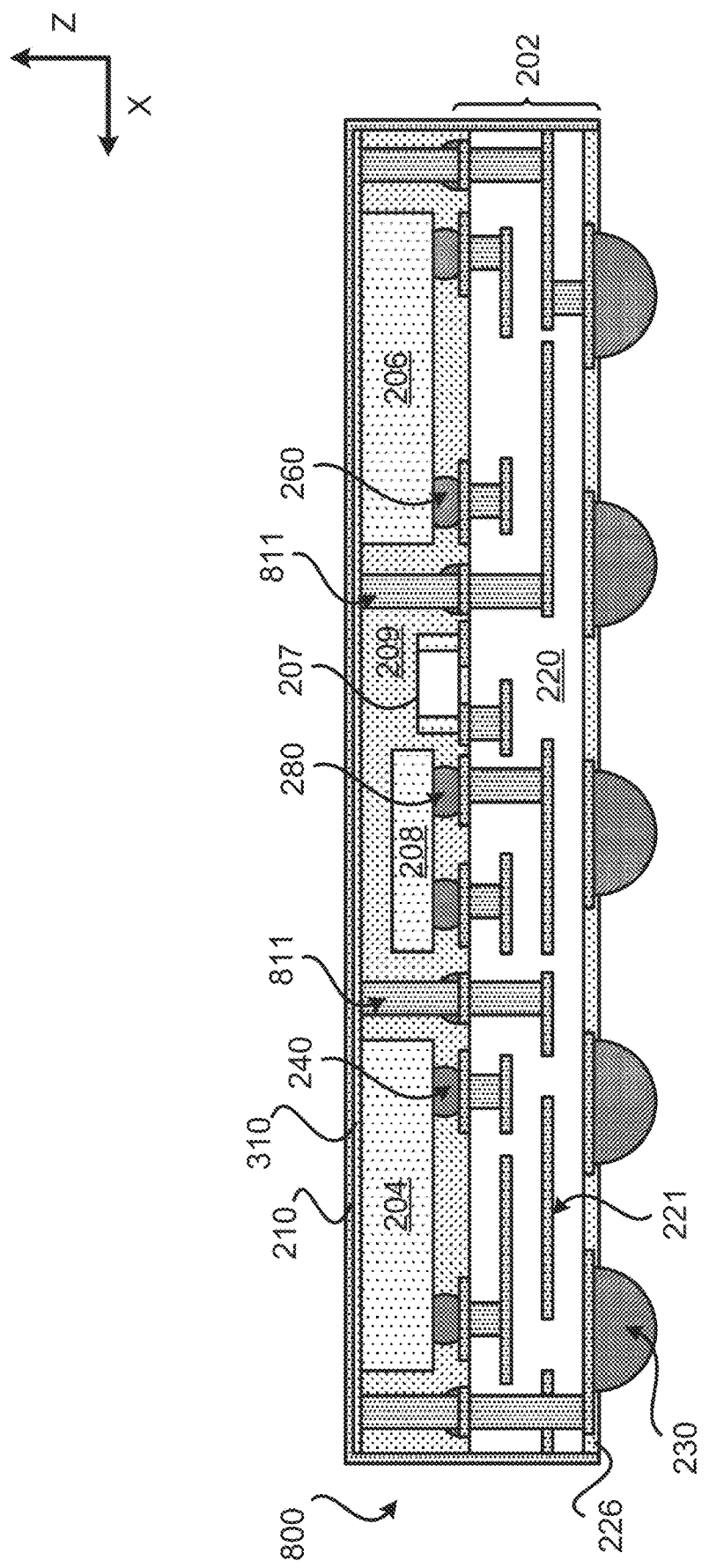
FIG. 8 illustrates a profile view of another package that includes a substrate, an integrated device, an encapsulation layer, and a metallized frame.

FIG. 8 illustrates a package 800 that includes different materials and/or structures configured for EMI shielding. The package 800 is similar to the package 300 and includes the same or similar components as the package 300 of FIG. 3. However, the package 800 includes a metallized frame 811 that is configured for an EMI shield. Thus, the metallized frame 811 has replaced the functionality of the TMVs 211 and/or the wire bonds 212. Some or all of the portions of the metallized frame 811 may be configured to be coupled to ground. The metallized frame 811 may be one component or several components. The metallized frame 811 may include one or more materials. The metallized frame 811 is an example of one or more encapsulation layer interconnects (e.g., means for encapsulation layer interconnection). A metallized frame 811 may include a lead frame or portions thereof.

Figure 9:
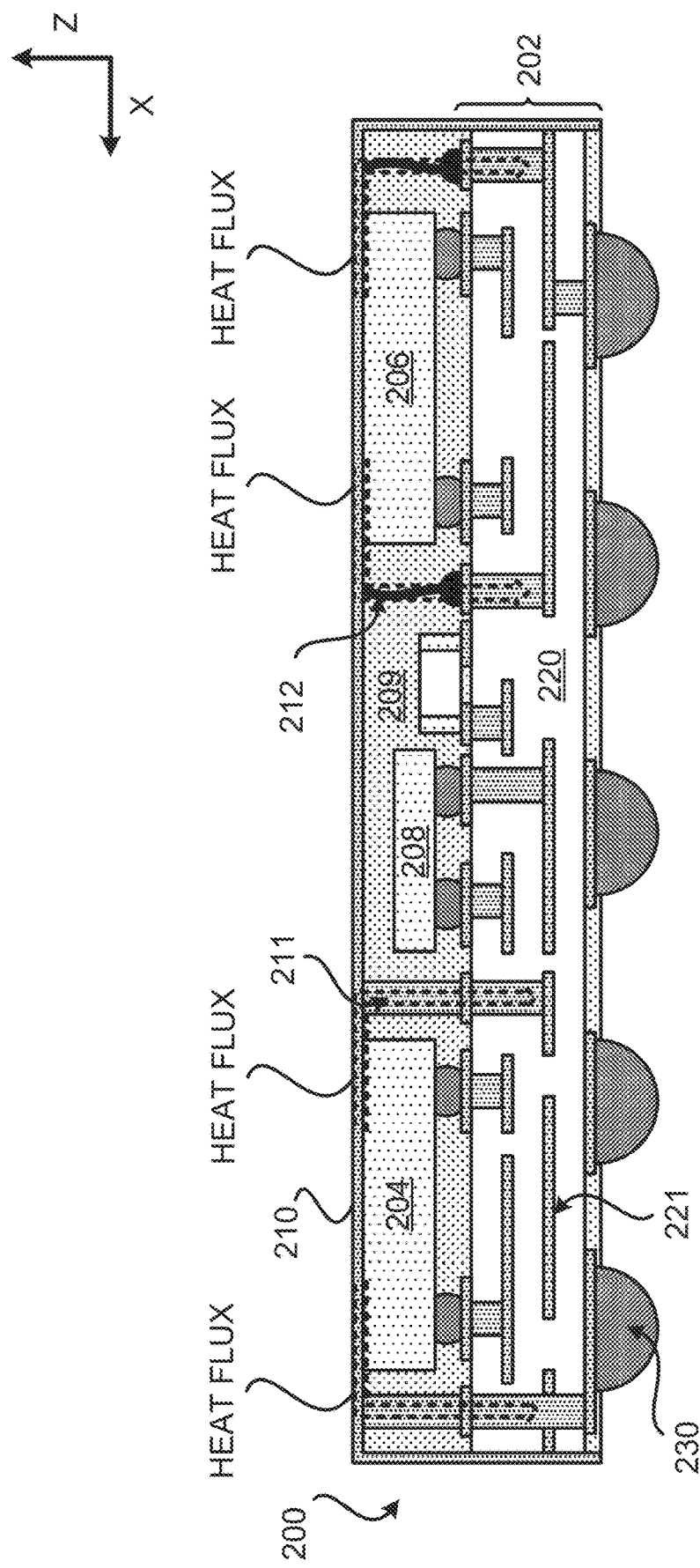
FIG. 9 illustrates an exemplary heat flow of a package that includes a substrate, an integrated device, an encapsulation layer, and a metal layer configured as an EMI shield.
Figure 10:
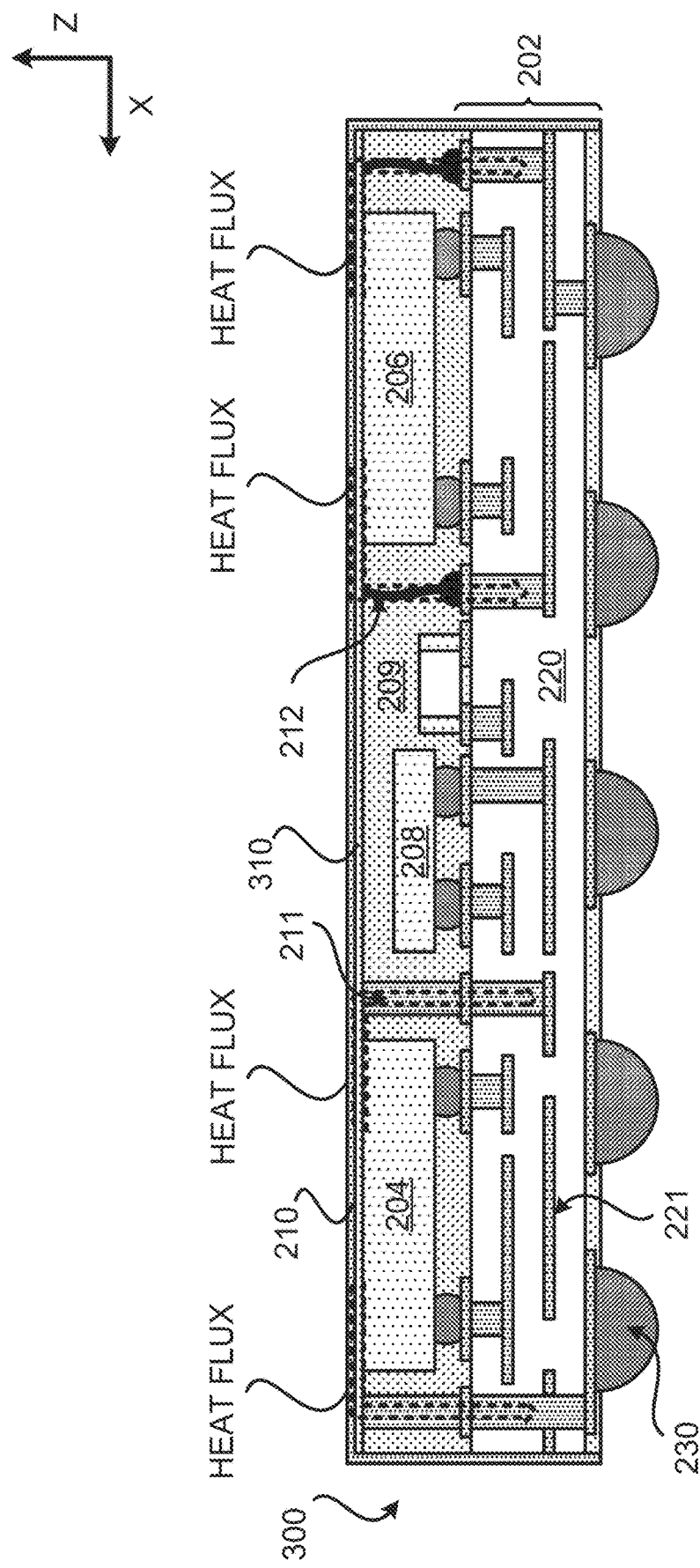
FIG. 10 illustrates an exemplary heat flow of a package that includes a substrate, an integrated device, an encapsulation layer, a thermal dielectric layer and a metal layer configured as an EMI shield.

FIGS. 9 and 10 illustrate examples of paths for heat and/or heat flux. It is noted that that the heat path and/or heat flux is not meant to show every possible heat path and/or heat flux. Instead, FIGS. 9 and 10 are merely intended to show one or many possible heat paths and/or heat flux for the packages. Thus, the heat path and/or heat flux is not limited to what is shown in FIGS. 9 and 10.

FIG. 9 illustrates an example of how heat from the integrated device 204 of the package 200 is dissipated (e.g., by conduction) through the backside of the integrated device 204, through the metal layer 210, through at least one TMV 211, and through the plurality of interconnects 221 of the substrate 202. In some implementations, at least some of the heat may dissipate through at least one solder interconnect 230.

FIG. 9 also illustrates an example of how heat from the integrated device 206 of the package 200 is dissipated (e.g., by conduction) through the backside of the integrated device 206, through the metal layer 210, through at least one wire bond 212, and through the plurality of interconnects 221 of the substrate 202. In some implementations, at least some of the heat may dissipate through at least one solder interconnect 230.

FIG. 10 illustrates an example of how heat from the integrated device 204 of the package 300 is dissipated (e.g., by conduction) through the backside of the integrated device 204, through the thermal dielectric layer 310, through the metal layer 210, through at least one TMV 211, and through the plurality of interconnects 221 of the substrate 202. In some implementations, at least some of the heat may dissipate through at least one solder interconnect 230.

FIG. 10 also illustrates an example of how heat from the integrated device 206 of the package 300 is dissipated (e.g., by conduction) through the backside of the integrated device 206, through the thermal dielectric layer 310, through the metal layer 210, through at least one wire bond 212, and through the plurality of interconnects 221 of the substrate 202. In some implementations, at least some of the heat may dissipate through at least one solder interconnect 230. The other packages that are described in the disclosure may dissipate heat in a similar manner. Thus, the other packages may have heat flux that travels in a similar manner as described in FIGS. 9 and 10.

The use of the configuration and design of the packages described in the disclosure may reduce the junction temperature of an integrated device (e.g., 204, 206) by as much as 100 Kelvin (K). Thus, for example, an integrated device where the backside is not coupled to a metal layer or a thermal dielectric layer, may reach a junction temperature (e.g., integrated device surface temperature) that is 100 K higher than the same integrated device where the backside is coupled to a metal layer and/or a thermal dielectric layer as described in the disclosure. For example, an integrated device where the backside is not coupled to a metal layer or a thermal dielectric layer, may reach a junction temperature (e.g., integrated device surface temperature) of about 300 Kelvin, while the same integrated device where the backside is coupled to a metal layer and/or a thermal dielectric layer as described in the disclosure, may reach a junction temperature of only 190 Kelvin (a difference of over 100 Kelvin). The lower temperature of the integrated device helps the integrated device and the package to perform optimally for a longer period of time and helps provide a more reliable integrated device and/or package.

Another benefit of the TMVs 211, the wire bonds 212, and/or the metallized frame 811 (which are examples of encapsulation layer interconnects), is that the TMVs 211, the wire bonds 212, and/or the metallized frame 811 may be configured as EMI shields (e.g., compartmental EMI shield, means for compartmental EMI shield).

Figure 11:
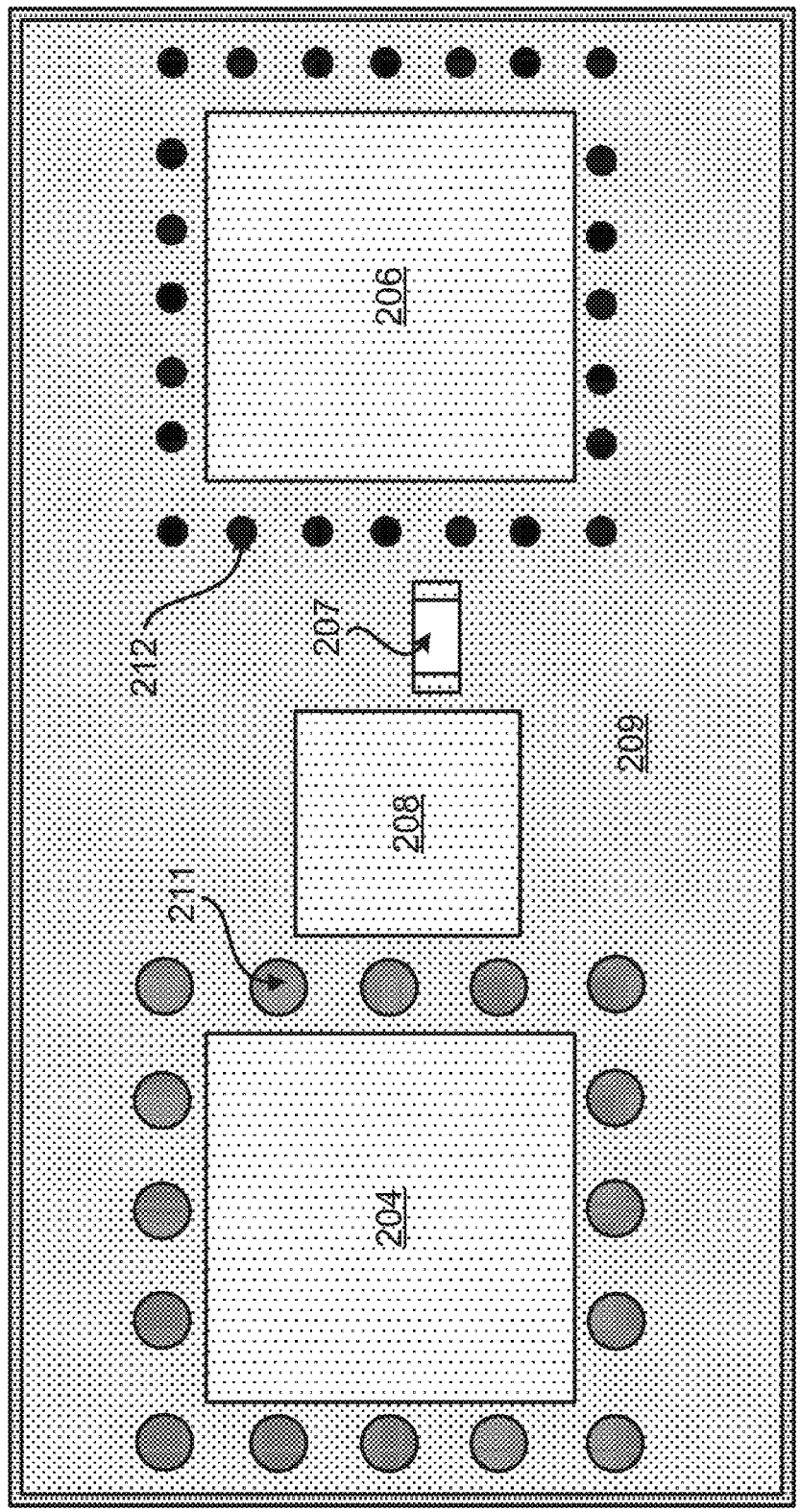
FIG. 11 illustrates a plan view of a package that includes a substrate, an integrated device, an encapsulation layer, and a metal layer configured as an EMI shield.

FIG. 11 illustrates a plan view of the package 200 that illustrates how the TMVs 211 and/or the wire bonds 212 may be arranged in the encapsulation layer 209. As shown in FIG. 8, the plurality of TMVs 211 is coupled to the substrate 202 such that the plurality of TMVs 211 laterally surrounds the integrated device 204. The plurality of TMVs 211 forms a fence, boundary and/or cage around the integrated device 204. The plurality of TMVs 211 is configured to be coupled to ground. The size, shape, spacing, and/or the number of TMVs 211 around the integrated device 204 may vary with different implementations. Even though there are gaps between the TMVs 211, the plurality of TMVs 211 may still provide effective EMI shielding, and the plurality of TMVs 211 may still be considered to laterally surround the integrated device 204.

As shown in FIG. 11, the plurality of wire bonds 212 is coupled to the substrate 202 such that the plurality of wire bonds 212 laterally surrounds the integrated device 206. The plurality of wire bonds 212 forms a fence, boundary and/or cage around the integrated device 206. The plurality of wire bonds 212 is configured to be coupled to ground. The size, shape, spacing, and/or the number of wire bonds 212 around the integrated device 206 may vary with different implementations. Even though there are gaps between the wire bonds 212, the plurality of wire bonds 212 may still provide effective EMI shielding, and the plurality of wire bonds 212 may still be considered to laterally surround the integrated device 206. In some implementations, a metallized frame 811 may laterally surround an integrated device in a similar manner Thus, the plurality of TMVs 211 and/or the plurality of wire bonds 212 may be replaced with one or more metallized frames 811.

It is noted that different packages may have different numbers of integrated devices and components. Thus, a package is not limited by a number of integrated devices. A package may include more than two integrated devices. Moreover, a package may mix and match different combinations of TMVs, wire bonds, metallized frames, and/or SMDs for EMI shielding and heat dissipation. In some implantations, only TMVs may be used for EMI shielding and heat dissipation. In some implementations, only wire bonds may be used for EMI shielding and heat dissipation. In some implantations, only metallized frame(s) may be used for EMI shielding and heat dissipation.

Having described various packages, a sequence for fabricating a package will now be described below.

Exemplary Sequence for Fabricating a Package Comprising a Substrate, an Integrated Device and a Metal Layer Configured for EMI Shield and Heat Dissipation FIGS. 12A-12D illustrate an exemplary sequence for providing or fabricating a package that includes a metal layer configured for EMI shield and heat dissipation. In some implementations, the sequence of FIGS. 12A-12D may be used to provide or fabricate the package 300 of FIG. 3, or any of the packages (e.g., 200, 400, 500, 600, 700, 800) described in the disclosure.

It should be noted that the sequence of FIGS. 12A-12D may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 12A:
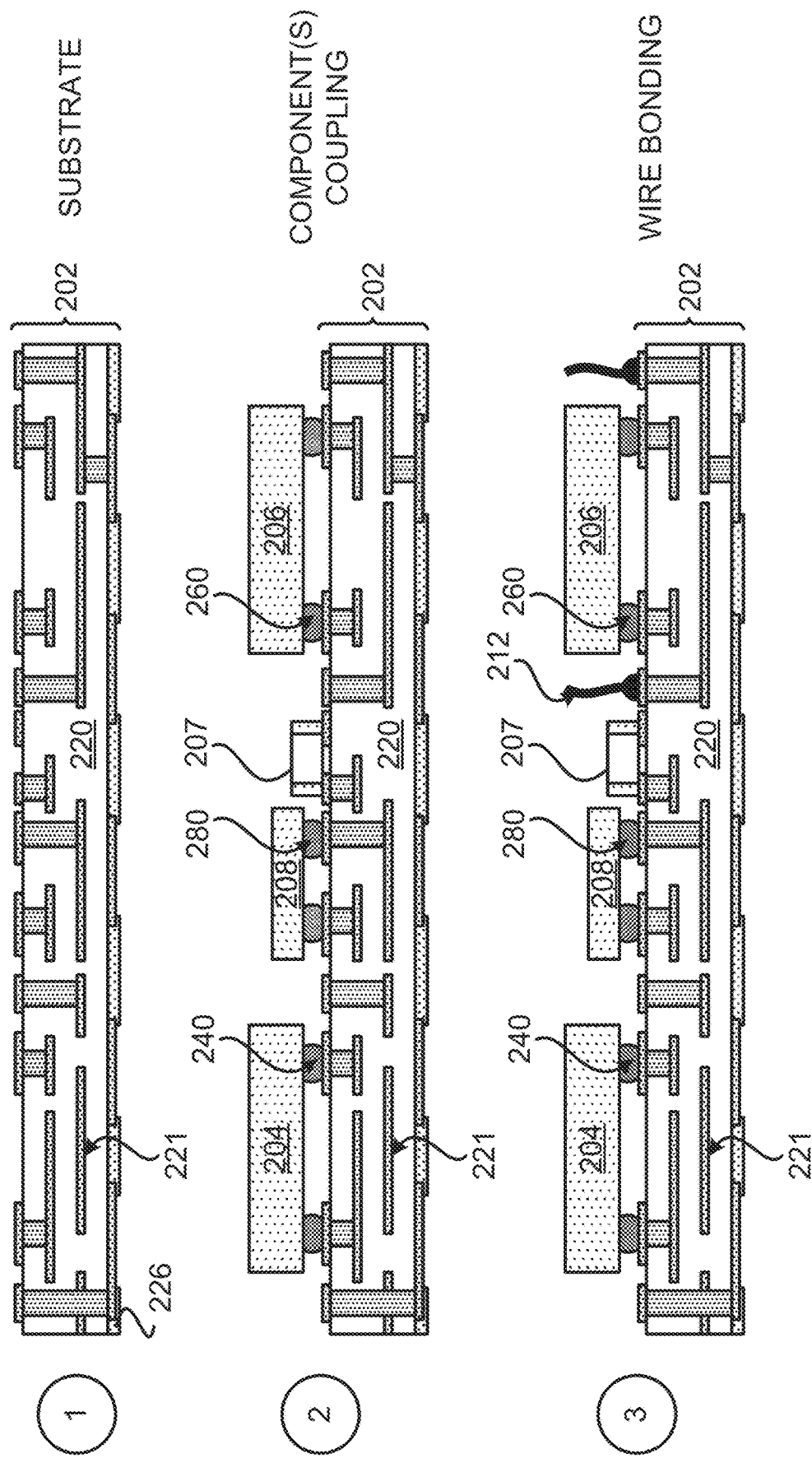
FIGS. 12A-12D illustrate an exemplary sequence for fabricating a package that includes a substrate, an integrated device, an encapsulation layer, a thermal dielectric layer and a metal layer configured as an EMI shield.

Stage 1, as shown in FIG. 12A, illustrates a state after a substrate 202 is provided or fabricated. The substrate 202 includes at least one dielectric layer 220, a plurality of interconnects 221 (e.g., traces, pads, vias), and a solder resist layer 226. An example of fabricating a substrate is shown and described in FIGS. 14A-14C. The fabrication of the substrate may include a lamination process and plating process. Examples of processes for fabricating a substrate includes a semi additive process (SAP) and a modified semi additive process (mSAP). However, different implementations may fabricate a substrate differently. Different implementations may provide different types of substrates (e.g., coreless substrate, core substrate, embedded trace substrate (ETS), laminate substrate, ceramic substrate).

Stage 2 illustrates a state after devices and/or components are coupled to the substrate 202. For example, the integrated device 204 is coupled to the substrate 202 through the plurality of solder interconnects 240. The integrated device 206 is coupled to the substrate 202 through the plurality of solder interconnects 260. The integrated device 208 is coupled to the substrate 202 through the plurality of solder interconnects 280. The passive component 207 (e.g., capacitor) may be coupled to the substrate 202. A pick and place process may be used to couple the devices and/or components. A reflow solder process may be used to couple the integrated device(s) and/or component(s).

Stage 3 illustrates a state after wire bonding. During wire bonding, a plurality of wire bonds 212 may be coupled to the substrate 202. The plurality of wire bonds 212 may be coupled to the plurality of interconnects 221. The plurality of wire bonds 212 may laterally surround at least one integrated device (e.g., 206). When a metallized frame (e.g., 811) is used the metallized frame may be coupled to the substrate 202.

Figure 12B:
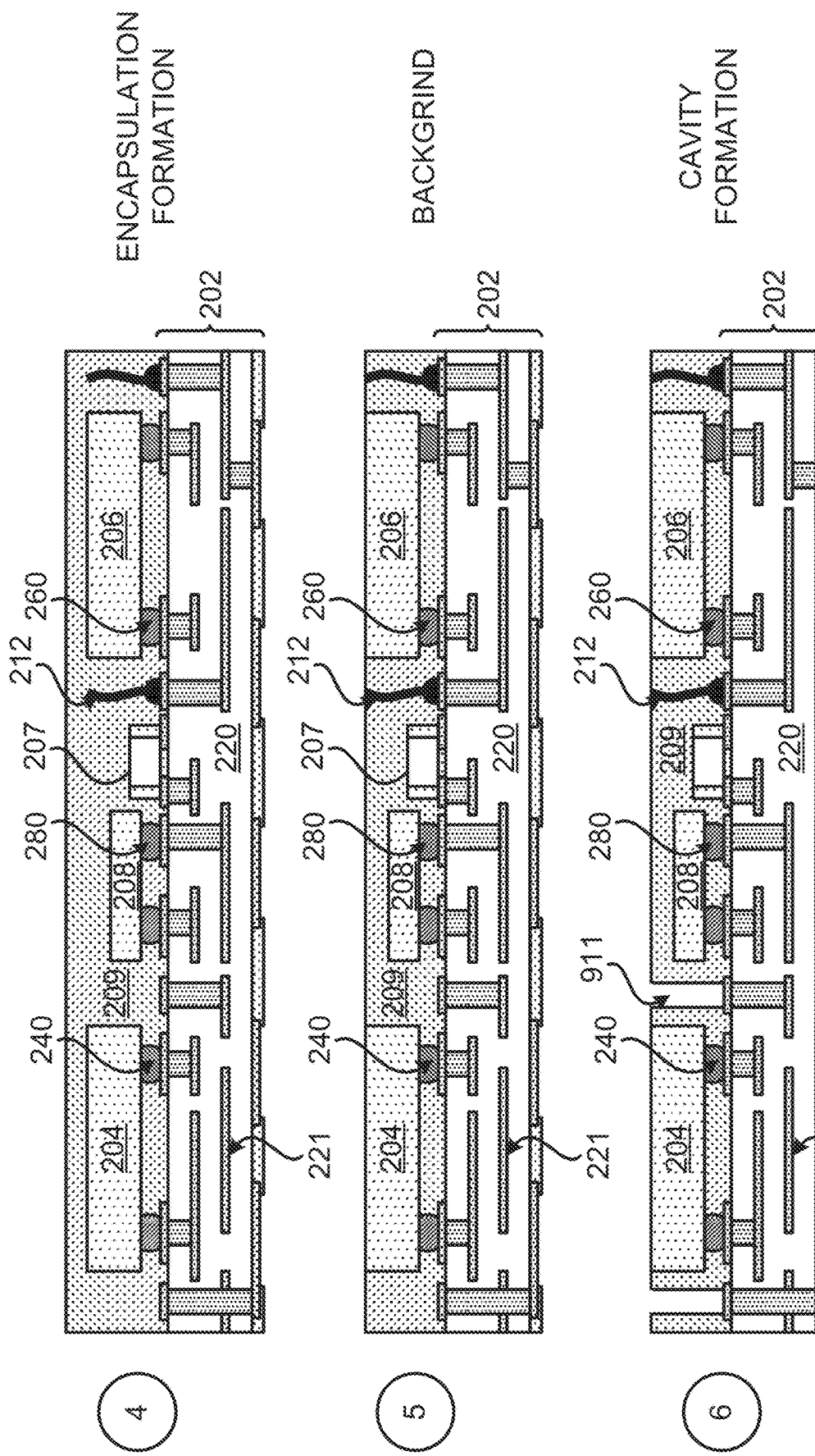

Stage 4, as shown in FIG. 12B, illustrates the encapsulation layer 209 that is formed over the substrate 202, the integrated device 204 and the integrated device 206. The encapsulation layer 209 may be a means for encapsulation. A compression molding process, a transfer molding process, or a liquid molding process may be used to form the encapsulation layer 209. The encapsulation layer 209 may at least partially encapsulate the integrated device 204, the integrated device 206 and the wire bonds 212.

Stage 5 illustrates a state after portions of the encapsulation layer 209 has been removed. The encapsulation layer 209 may be removed through a grinding process. In some implementations, some of the encapsulation layer 209 may be grinded so that the encapsulation layer 209 is planar with a backside of one or more integrated devices. The encapsulation layer 209 may at least partially encapsulate the integrated device 204, the integrated device 206 and the wire bonds 212.

Stage 6, illustrates a state after a plurality of cavities 911 are formed in the encapsulation layer 209. A laser process and/or an etching process may be used to form the plurality of cavities. The cavities 911 may extend through the encapsulation layer 209 and expose part of the substrate 202.

Figure 12C:
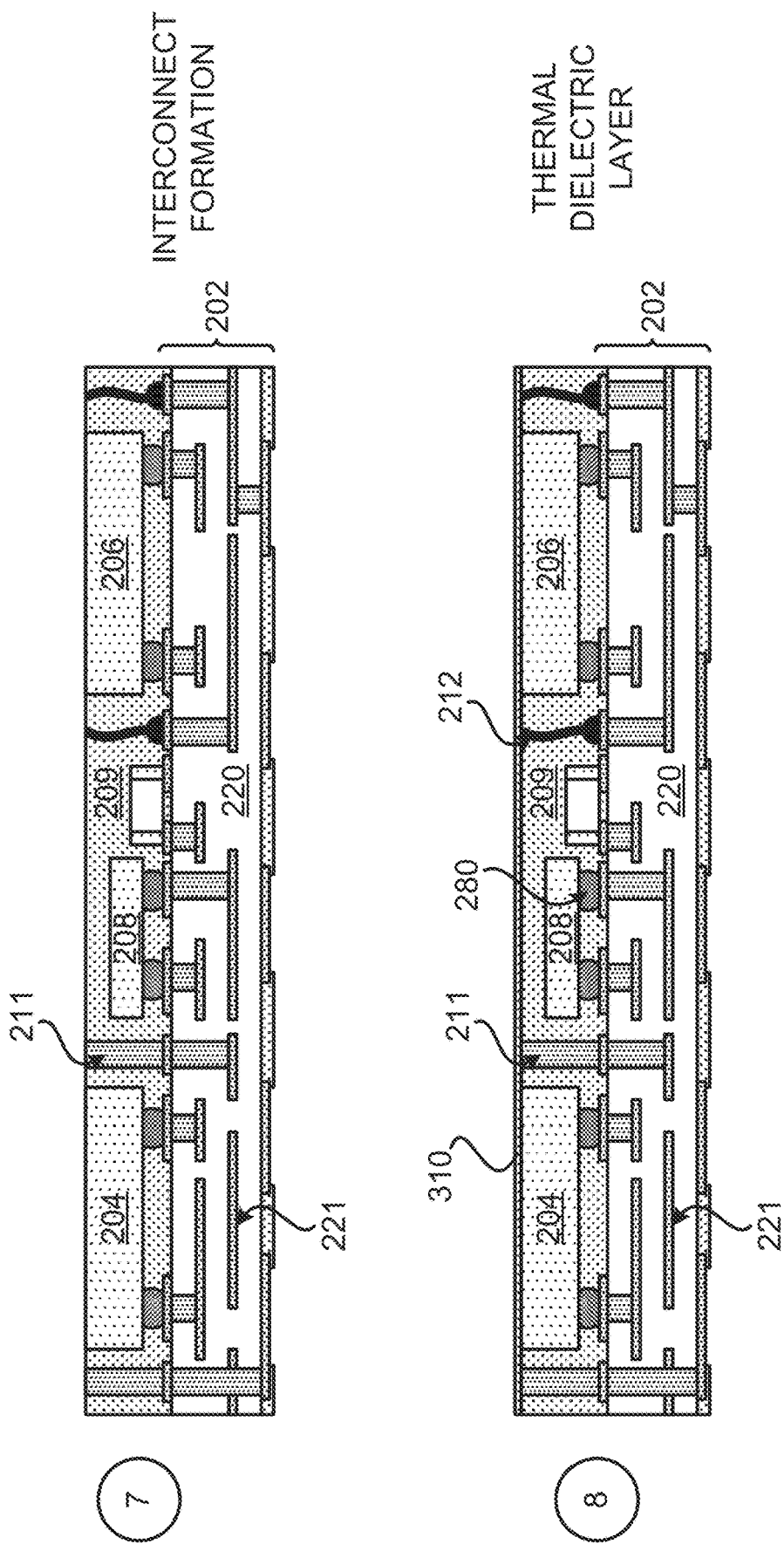

Stage 7, as shown in FIG. 12C, illustrates a state after the plurality of TMVs 211 is formed in the plurality of cavities 911 of the encapsulation layer 209. A plating process may be used the plurality of TMVs 211. The plurality of TMVs 211 may laterally surround at least one integrated device (e.g., 204). In some implementations, a grinding process may be used to remove portions of the encapsulation layer 209, portions of the plurality of wire bonds 212 and/or portions of the TMVs 211, such that the encapsulation layer 209, the plurality of TMVs 211 and the plurality of wire bonds 212 are planar with the backside of at least one integrated device (e.g., 204, 206).

Stage 8 illustrates a state after a thermal dielectric layer 310 is optionally formed over the encapsulation layer 209, the backside of at least one integrated device (e.g., 204, 206), the plurality of TMVs 211, and the plurality of wire bonds 212. A deposition process may be used to form and couple the thermal dielectric layer 310 to the encapsulation layer 209, the backside of at least one integrated device (e.g., 204, 206), the plurality of TMVs 211, and the plurality of wire bonds 212. In some implementations, the thermal dielectric layer 310 may include several dielectric layers. Stage 8 may illustrate the package 600, as described in FIG. 6. In some implementations, a laser process may be used to remove portions of the thermal dielectric layer 310 to fabricate the package 700, as described in FIG. 7.

Figure 12D:
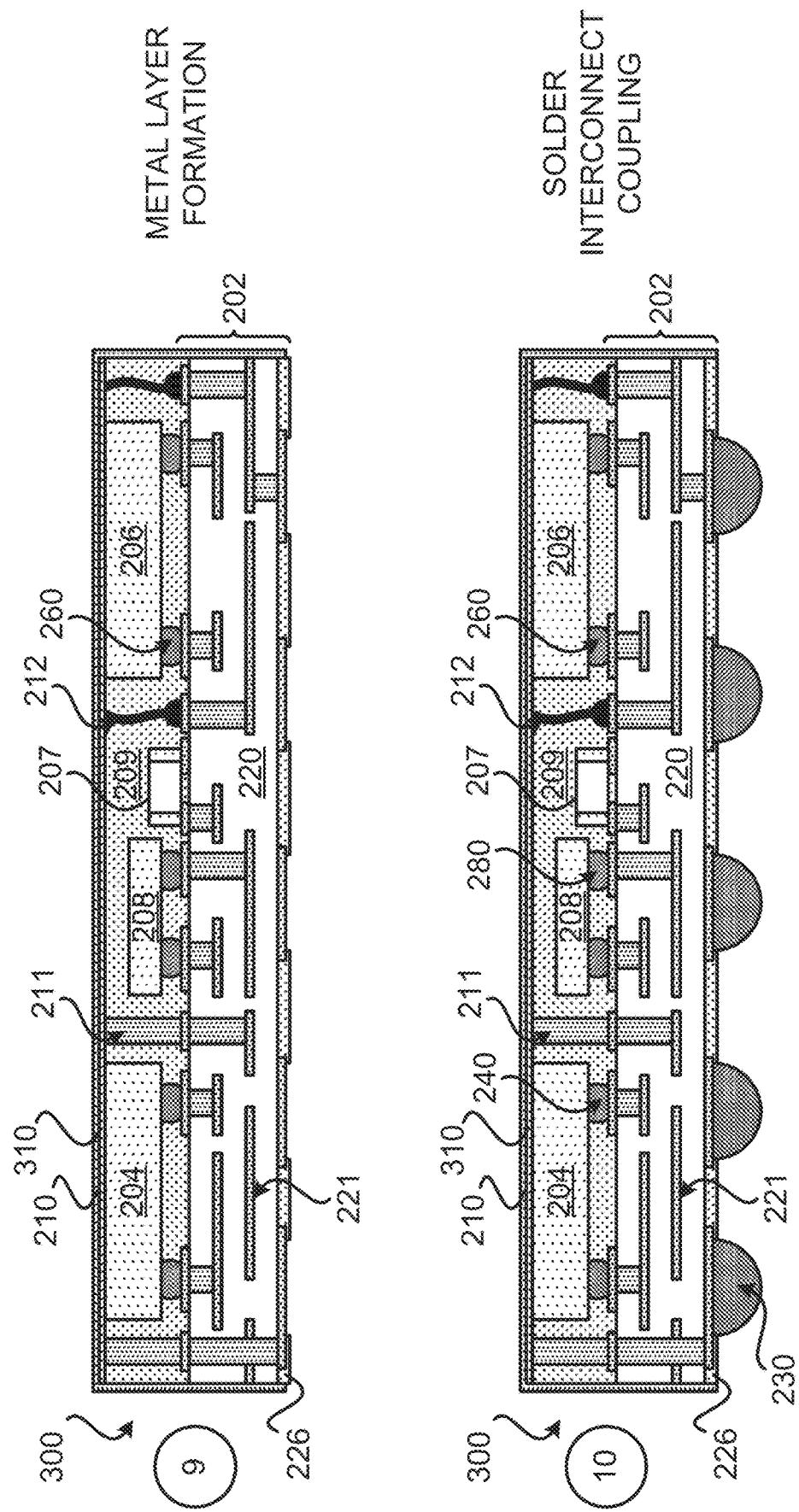

Stage 9, as shown in FIG. 12D, illustrates a state after a metal layer 210 is formed over the thermal dielectric layer 310, the encapsulation layer 209, the backside of at least one integrated device (e.g., 204, 206), the plurality of TMVs 211, and the plurality of wire bonds 212. A plating process and/or a sputtering process may be used to form and couple the metal layer 210 to the thermal dielectric layer 310. When there is no thermal dielectric layer 310, the metal layer 210 may be formed and coupled to the encapsulation layer 209, the backside of at least one integrated device (e.g., 204, 206), the plurality of TMVs 211, and the plurality of wire bonds 212. In the example of Stage 9 of FIG. 12D, the metal layer 210 is also optionally formed over the side surface of the encapsulation layer 209 and the side surface of the substrate 202. However, the metal layer 210 may be formed over the package differently by different implementations. As mentioned above, the metal layer 210 may be configured for EMI shield and heat dissipation. Stage 9 may illustrate the package 300, as described in FIG. 3.

Stage 10 illustrates a state after the plurality of solder interconnects 230 is coupled to the substrate 202. The plurality of solder interconnects 230 may be coupled to the plurality of interconnects 221 through a reflow solder process. Stage 10 may illustrate the package 300, as described in FIG. 3.

Figure 13:
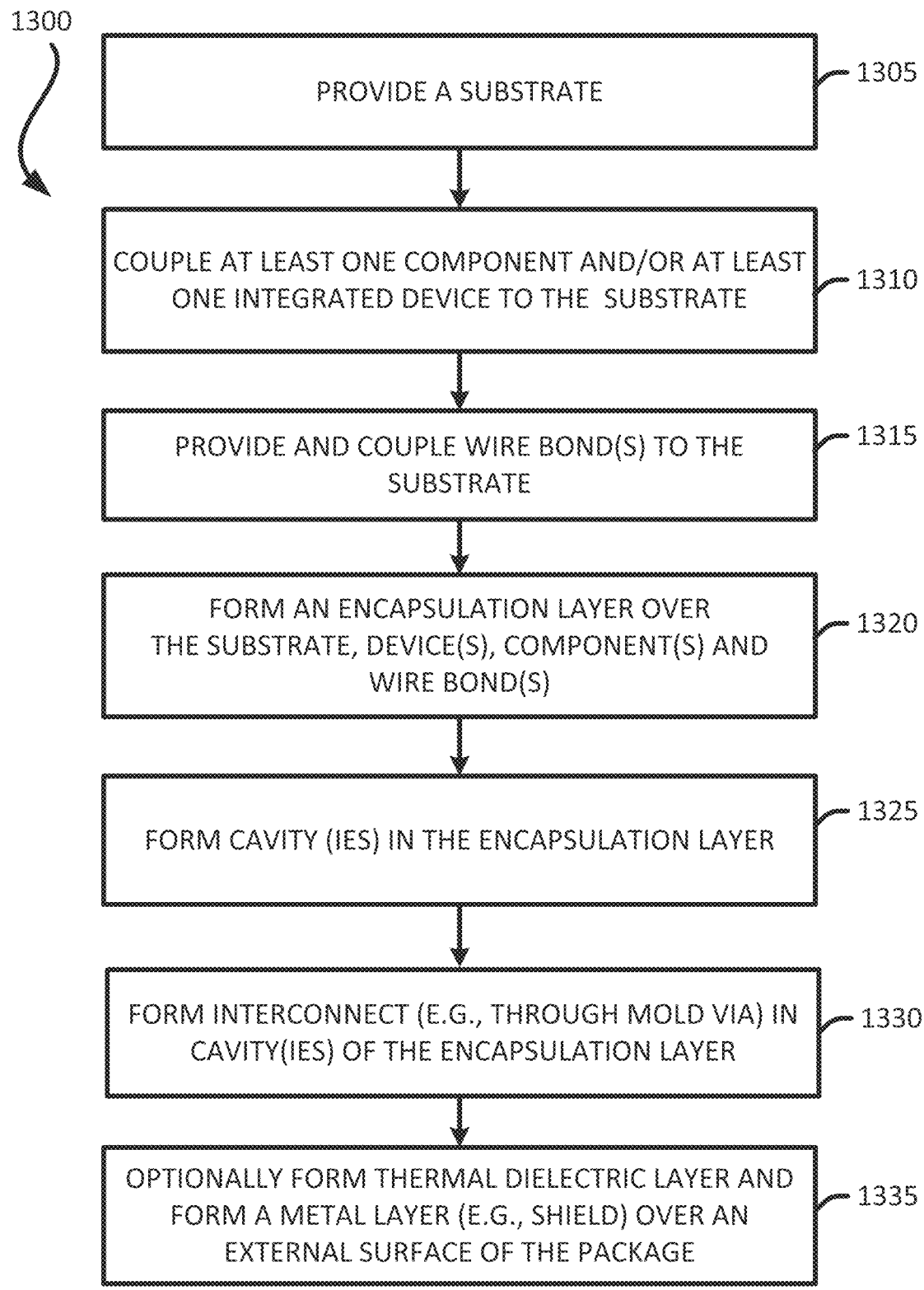
FIG. 13 illustrates an exemplary flow diagram of a method for fabricating package that includes a substrate, an integrated device, and an encapsulation layer with controlled undercut.

Exemplary Flow Diagram of a Method for Fabricating a Package Comprising a Substrate, an Integrated Device and a Metal Layer Configured for EMI Shield and Heat Dissipation In some implementations, fabricating a package that includes a metal layer configured for EMI shield and heat dissipation includes several processes. FIG. 13 illustrates an exemplary flow diagram of a method 1300 for providing or fabricating a package that includes a metal layer configured for EMI shield and heat dissipation. In some implementations, the method 1300 of FIG. 13 may be used to provide or fabricate the package 300 of FIG. 3 described in the disclosure. However, the method 1300 may be used to provide or fabricate any of the packages (e.g., 200, 400, 500, 600, 700, 800) described in the disclosure.

It should be noted that the sequence of FIG. 13 may combine one or more processes in order to simplify and/or clarify the method for providing or fabricating a package. In some implementations, the order of the processes may be changed or modified.

The method provides (at 1305) a substrate (e.g., 202). The substrate may be provided or fabricated. The substrate may include at least one dielectric layer 220, a plurality of interconnects 221 (e.g., traces, pads, vias), and a solder resist layer 226. An example of fabricating a substrate is shown and described in FIGS. 14A-14C. The fabrication of the substrate may include a lamination process and plating process. Examples of processes for fabricating a substrate includes a semi additive process (SAP) and a modified semi additive process (mSAP). However, different implementations may fabricate a substrate differently. Different implementations may provide different types of substrates (e.g., coreless substrate, core substrate, embedded trace substrate (ETS), laminate substrate, ceramic substrate). Stage 1 of FIG. 12A illustrates and describes an example of a substrate.

The method couples (at 1310) at least one device (e.g., 204, 206, 208) to the substrate (e.g., 202). A passive component (e.g., 207) may also be coupled to the substrate 202. A pick and place process may be used to couple at least one integrated device and at least one component to the substrate. Stage 2 of FIG. 12A illustrates and describes an example of coupling integrated devices and a component to a substrate.

The method optionally provides (at 1315) wire bonds (e.g., 212). Providing wire bonds includes coupling a plurality of wire bonds 212 to the substrate 202. The plurality of wire bonds 212 may be coupled to the plurality of interconnects 221. The plurality of wire bonds 212 may laterally surround at least one integrated device (e.g., 206). Stage 3 of FIG. 12A illustrates and describes an example of providing wire bonds. In some implementations, the method may couple (at 1315) a metallized frame (e.g., 811) and/or SMDs to the substrate 2020.

The method forms (at 1320) an encapsulation layer (e.g., 209) over the substrate. The encapsulation layer 209 may be formed over the substrate 202, the integrated device 204 and the integrated device 206. A compression molding process, a transfer molding process, or a liquid molding process may be used to form the encapsulation layer 209. In some implementations, some of the encapsulation layer 209 may be grinded so that the encapsulation layer 209 is planar with a backside of one or more integrated devices. The encapsulation layer 209 may at least partially encapsulate the integrated device 204, the integrated device 206 and the wire bonds 212. Stages 4 and 5 of FIG. 12B illustrates and describes an example of forming and grinding an encapsulation layer.

The method forms (at 1325) cavities (e.g., 911) in the encapsulation layer (e.g., 209). A laser process and/or an etching process may be used to form the plurality of cavities 911. The plurality of cavities 911 may extend through the encapsulation layer 209 and expose part of the substrate 202. Stage 6 of FIG. 12B illustrates and describes an example of forming cavities in an encapsulation layer.

The method forms (at 1330) at least one encapsulation layer interconnect in the cavities of the encapsulation layer. Forming the encapsulation layer interconnects may include forming a plurality of TMVs 211 in the plurality of cavities 911 of the encapsulation layer 209. A plating process may be used the plurality of TMVs 211. The plurality of TMVs 211 may laterally surround at least one integrated device (e.g., 204). In some implementations, a grinding process may be used to remove portions of the encapsulation layer 209, portions of the plurality of wire bonds 212 and/or portions of the TMVs 211, such that the encapsulation layer 209, the plurality of TMVs 211 and the plurality of wire bonds 212 are planar with the backside of at least one integrated device (e.g., 204, 206). Stage 7 of FIG. 12C illustrates and describes an example of forming encapsulation layer interconnects.

The method optionally forms (at 1335) a thermal dielectric layer 310 over the encapsulation layer 209, the backside of at least one integrated device (e.g., 204, 206), the plurality of TMVs 211, and the plurality of wire bonds 212. A deposition process may be used to form and couple the thermal dielectric layer 310 to the encapsulation layer 209, the backside of at least one integrated device (e.g., 204, 206), the plurality of TMVs 211, and the plurality of wire bonds 212. In some implementations, several thermal dielectric layers may be formed. Stage 8 of FIG. 12C illustrates and describes an example of forming a thermal dielectric layer.

The method optionally forms (at 1335) a metal layer 210 over the thermal dielectric layer 310, the encapsulation layer 209, the backside of at least one integrated device (e.g., 204, 206), the plurality of TMVs 211, and the plurality of wire bonds 212. A plating process and/or a sputtering process may be used to form and couple the metal layer 210 to the thermal dielectric layer 310. When there is no thermal dielectric layer 310, the metal layer 210 may be formed and coupled to the encapsulation layer 209, the backside of at least one integrated device (e.g., 204, 206), the plurality of TMVs 211, and the plurality of wire bonds 212. In the example of Stage 9 of FIG. 12D, the metal layer 210 is also optionally formed over the side surface of the encapsulation layer 209 and the side surface of the substrate 202. The method may form several metal layers. However, the metal layer 210 may be formed over the package differently by different implementations. As mentioned above, the metal layer 210 may be configured for EMI shield and heat dissipation. In some implementations, the method may form (at 1335) at least one dielectricum layer over the encapsulation layer 209, the backside of at least one integrated device (e.g., 204, 206), the plurality of TMVs 211, and the plurality of wire bonds 212. Stage 9 of FIG. 12C illustrates and describes an example of forming a metal layer that is configured for EMI shield and heat dissipation.

The method 1300 may also couple a plurality of solder interconnects 230 to the substrate 202. The plurality of solder interconnects 230 may be coupled to the plurality of interconnects 221 through a reflow solder process. Stage 10 of FIG. 12C illustrates and describes an example of solder interconnects coupled to the substrate.

Exemplary Sequence for Fabricating a Substrate

Figure 14A:
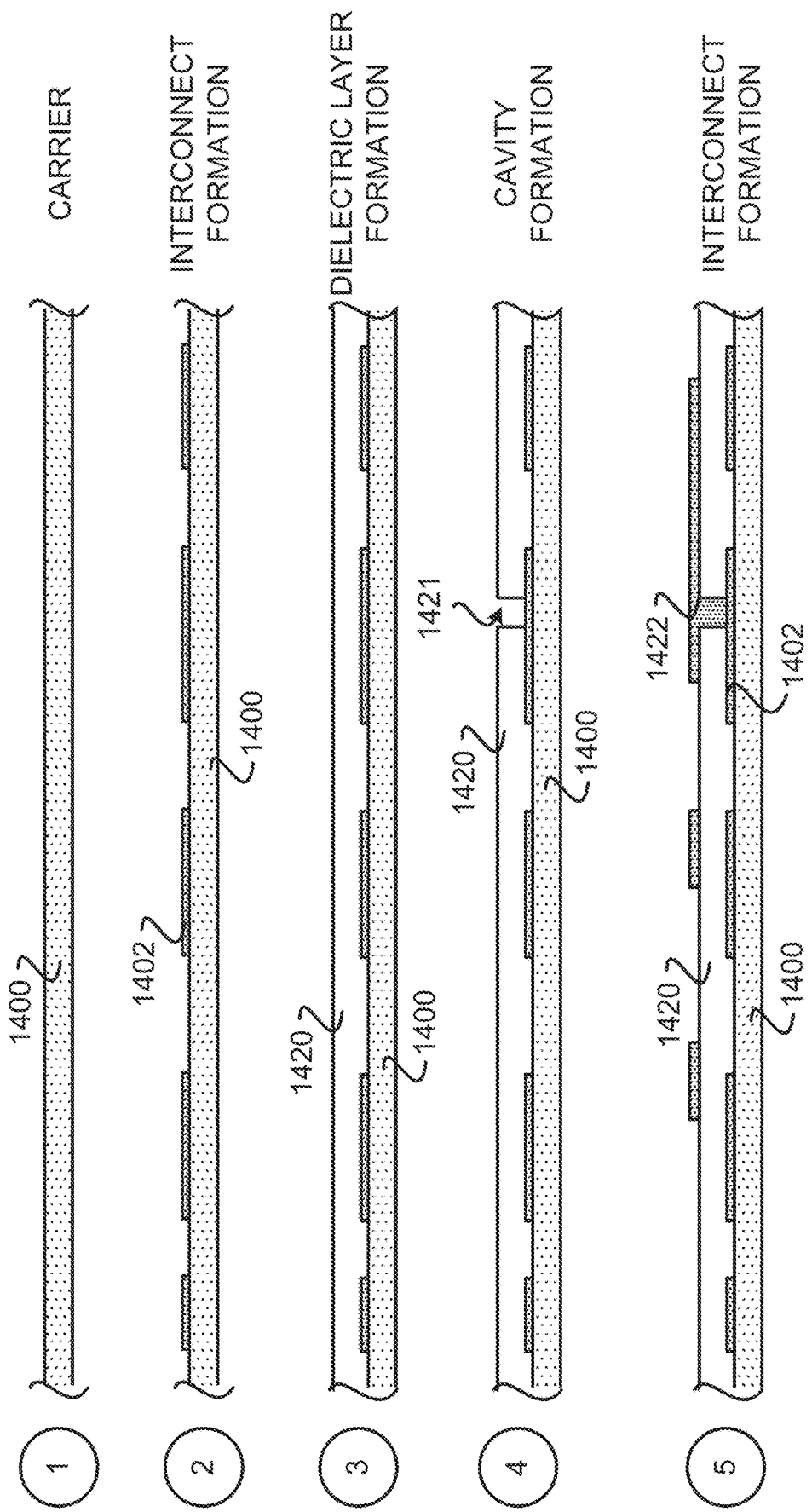
FIGS. 14A-14C illustrate an exemplary sequence for fabricating a substrate.
Figure 14B:
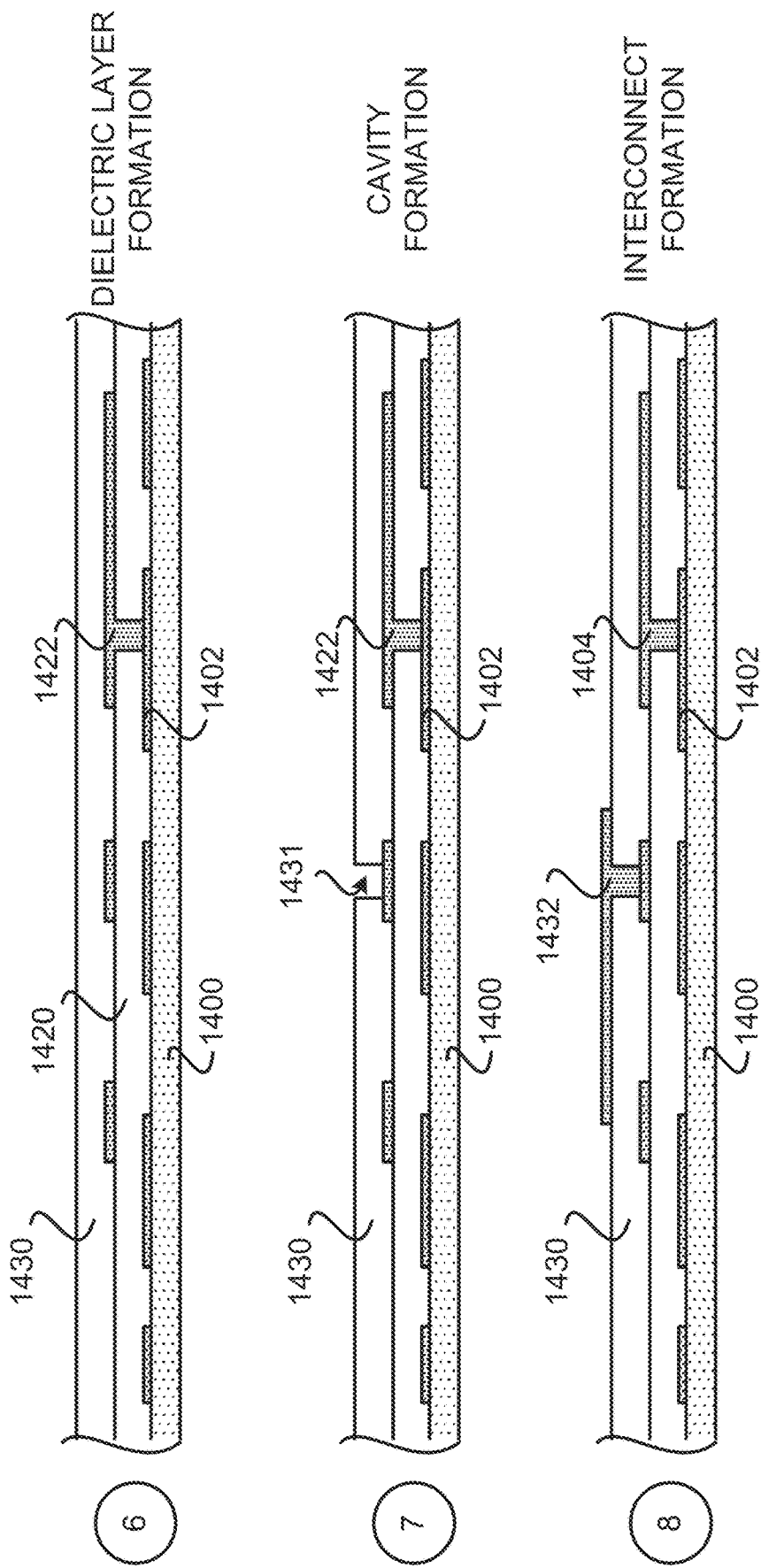
Figure 14C:
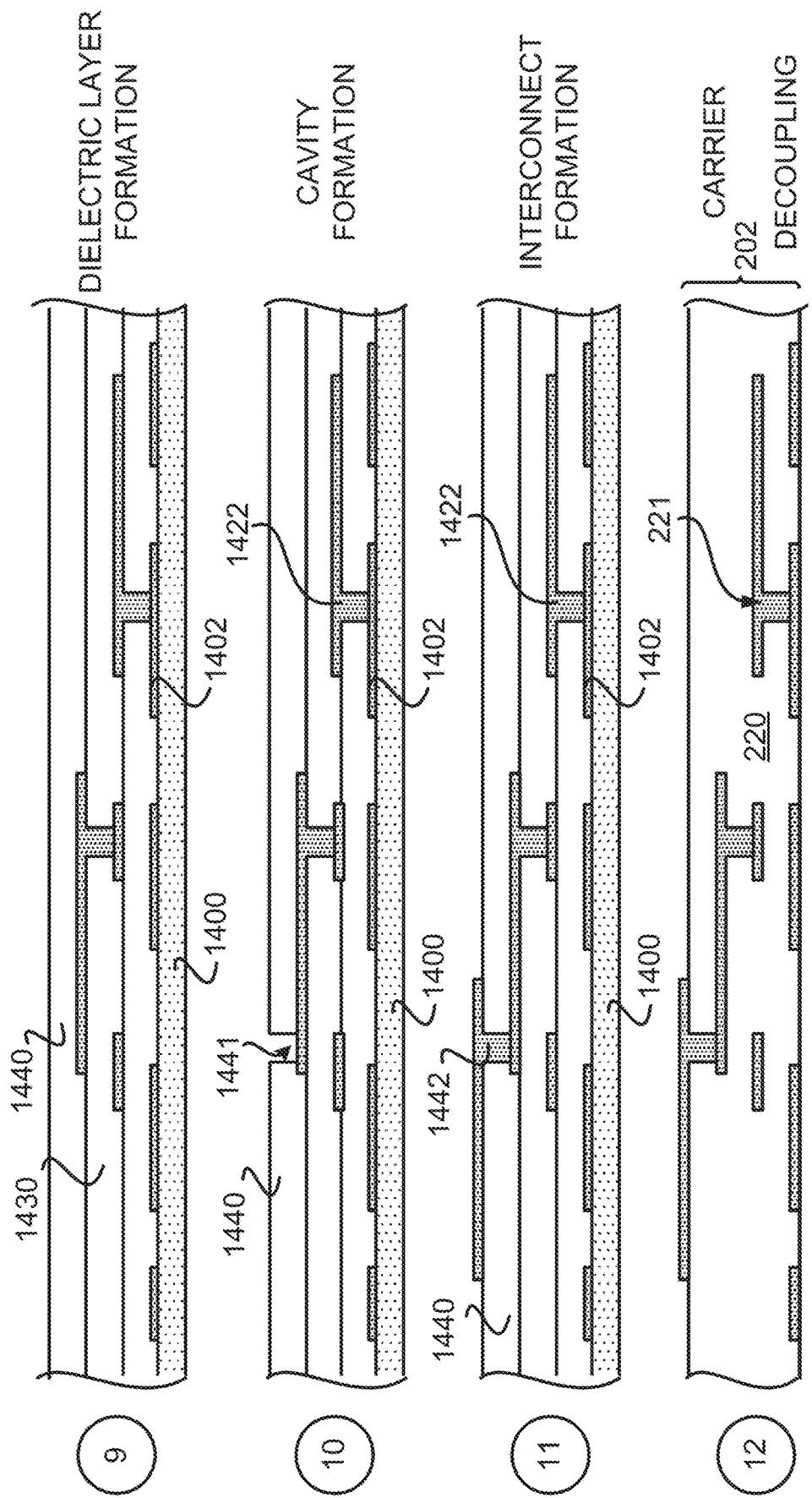

FIGS. 14A-14C illustrate an exemplary sequence for providing or fabricating a substrate. In some implementations, the sequence of FIGS. 14A-14C may be used to provide or fabricate the substrate 202 of FIG. 3, or any of the substrates described in the disclosure. As mentioned above, different implementations may use different substrate, including a laminate substrate and a coreless substrate (e.g., embedded trace substrate). The substrate shown in FIG. 14A-14C is an example of a possible substrate that may be used.

It should be noted that the sequence of FIGS. 14A-14C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 14A, illustrates a state after a carrier 1400 is provided. The carrier 1400 may be a substrate.

Stage 2 illustrates a state after interconnects 1402 are formed over the carrier 1400. The interconnects 1402 may be interconnects from the plurality of interconnects 221. A plating process may be used to form the interconnects 1402.

Stage 3 illustrates a state after a dielectric layer 1420 is formed over the interconnects 1402 and the carrier 1400. A deposition and/or lamination process may be used to form the dielectric layer 1420.

Stage 4 illustrates a state after one or more cavities 1421 are formed in the dielectric layer 1420. A laser process (e.g., laser ablation) or a photo etching process (e.g., photolithography process) may be used to form the one or more cavities 1421.

Stage 5 illustrates a state after interconnects 1422 are formed over the dielectric layer 1420. The interconnects 1422 may be interconnects from the plurality of interconnects 221. A plating process may be used to form the interconnects 1422.

Stage 6, as shown in FIG. 14B, illustrates a state after a dielectric layer 1430 is formed over the dielectric layer 1420. The dielectric layer 1430 may be made of the same material as the dielectric layer 1420. A deposition and/or lamination process may be used to form the dielectric layer 1430.

Stage 7 illustrates a state after one or more cavities 1431 are formed in the dielectric layer 1430. A laser process (e.g., laser ablation) or a photo etching process (e.g., photolithography process) may be used to form the one or more cavities 1431.

Stage 8 illustrates a state after interconnects 1432 are formed over the dielectric layer 1430. The interconnects 1432 may be interconnects from the plurality of interconnects 221. A plating process may be used to form the interconnects 1432.

Stage 9, as shown in FIG. 14C, illustrates a state after a dielectric layer 1440 is formed over the dielectric layer 1430. The dielectric layer 1440 may be made of the same material as the dielectric layer 1430. A deposition and/or lamination process may be used to form the dielectric layer 1440.

Stage 10 illustrates a state after one or more cavities 1441 are formed in the dielectric layer 1440. A laser process (e.g., laser ablation) or a photo etching process (e.g., photolithography process) may be used to form the one or more cavities 1441.

Stage 11 illustrates a state after interconnects 1442 are formed over the dielectric layer 1440. The interconnects 1442 may be interconnects from the plurality of interconnects 221. A plating process may be used to form the interconnects 1442.

Stage 12 illustrates a state after the carrier 1400 is removed. Stage 12 may illustrate a portion of the substrate 202. The dielectric layer 220 may represent the dielectric layers 1420, 1430 and 1440. The interconnects 221 may represent the interconnects 1402, 1422, 1432 and 1442.

It is noted that some of the stages may be iteratively repeated to form additional dielectric layers and/or metal layers (e.g., for interconnects).

Exemplary Electronic Devices

Figure 15:
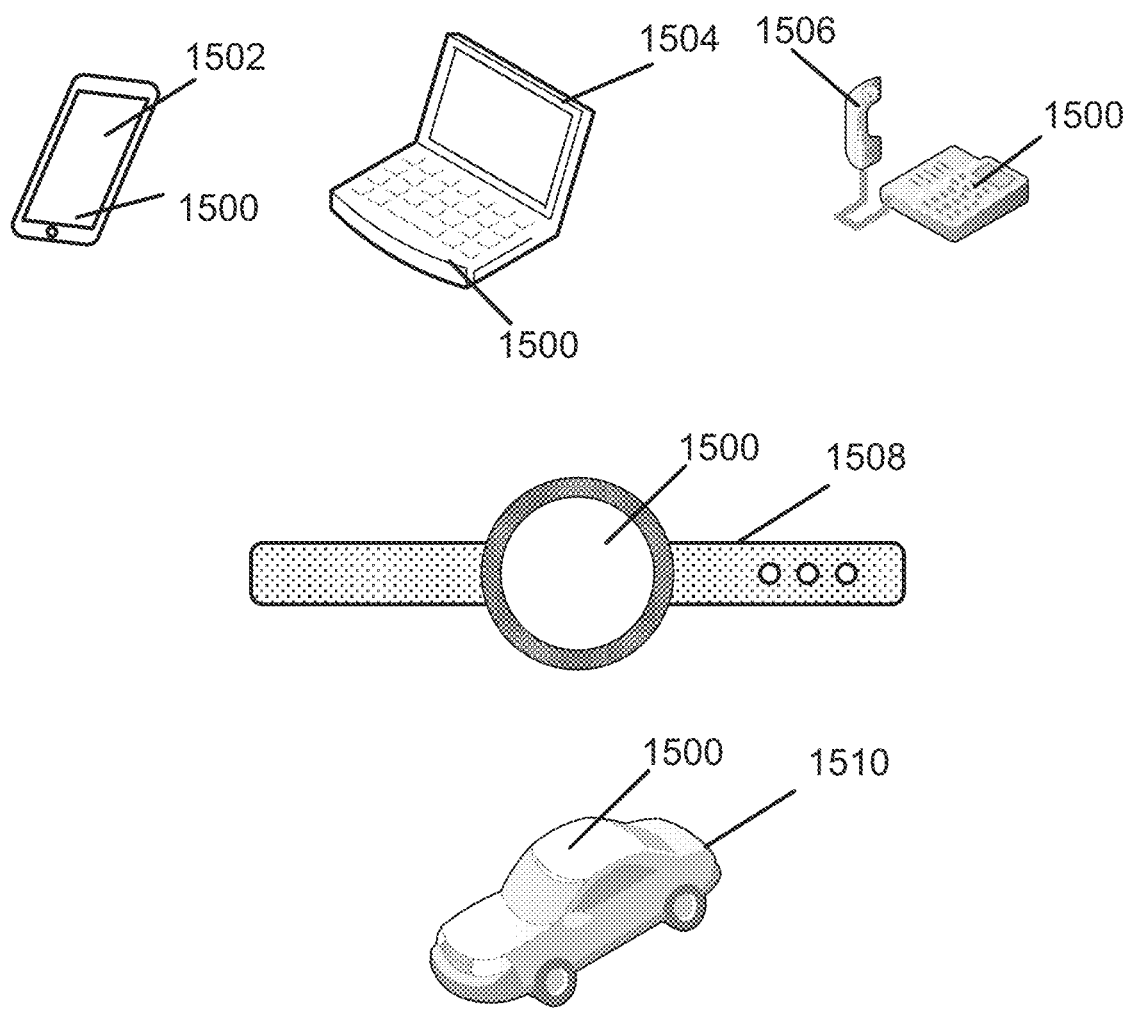
FIG. 15 illustrates various electronic devices that may integrate a die, an integrated device, an integrated passive device (IPD), a passive component, a package, and/or a device package described herein.

FIG. 15 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-11, 12A-12D, 13, 14A-14C, and/or 15 may be rearranged and/or combined into a single component, process, feature or function or embodied in several components, processes, or functions. Additional elements, components, processes, and/or functions may also be added without departing from the disclosure. It should also be noted FIGS. 2-11, 12A-12D, 13, 14A-14C, and/or 15 and its corresponding description in the present disclosure is not limited to dies and/or ICs. In some implementations, FIGS. 2-11, 12A-12D, 13, 14A-14C, and/or 15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "surrounded" means that the object may partially surround or completely surround another object. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may include more than one element or component. An interconnect may be defined by one or more interconnects. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate, an integrated device coupled to the substrate, an encapsulation layer located over the substrate, at least one encapsulation layer interconnect located in the encapsulation layer, and at least one metal layer located over the encapsulation layer. The substrate comprising at least one dielectric layer; and a plurality of interconnects. The at least one encapsulation layer interconnect is coupled to the substrate. The at least one metal layer is configured as an electromagnetic interference (EMI) shield for the package. The at least one metal layer is located over a backside of the integrated device.

Aspect 2: The package of aspect 1, wherein the at least one metal layer is configured as a conformal EMI shield for the package, wherein the at least one encapsulation layer interconnect is configured as a compartmental EMI shield for the package.

Aspect 3: The package of aspects 1 through 2, wherein the at least one encapsulation layer interconnect includes at least one through mold via (TMV) and/or at least one wire bond.

Aspect 4: The package of aspect 3, wherein the at least one through mold via (TMV) and/or the at least one wire bond is coupled to the plurality of interconnects of the substrate.

Aspect 5: The package of aspects 1 through 4, wherein the package includes a plurality of integrated devices coupled to the substrate.

Aspect 6: The package of aspects 1 through 5, wherein the at least one metal layer and the at least one encapsulation layer interconnect is configured to be coupled to ground.

Aspect 7: The package of aspects 1 through 6, wherein the at least one metal layer and the at least one encapsulation layer interconnect are configured to dissipate heat from the integrated device through (i) the backside of the integrated device, (ii) the at least one metal layer, (iii) the at least one encapsulation layer interconnect, and (iv) the plurality of interconnects of the substrate.

Aspect 8: The package of aspect 7, wherein a majority of the heat that is generated by the integrated device is dissipated by heat conduction through (i) the backside of the integrated device, and (ii) the at least one metal layer, (iii) the at least one encapsulation layer interconnect, and (iv) the plurality of interconnects of the substrate.

Aspect 9: The package of aspect 7, wherein at least twenty percent (20%) of the heat that is generated by the integrated device is dissipated by heat conduction through (i) the backside of the integrated device, and (ii) the at least one metal layer, (iii) the at least one encapsulation layer interconnect, and (iv) the plurality of interconnects of the substrate.

Aspect 10: The package of aspects 1 through 9, further comprising a second integrated device coupled to the substrate, wherein the at least one metal layer is located over a backside of the second integrated device, wherein the at least one metal layer is configured as an EMI shield for the integrated device and the second integrated device, wherein the at least one metal layer is configured to be coupled to ground, and wherein the at least one metal layer is further configured to dissipate heat away from the integrated device and the second integrated device.

Aspect 11: The package of aspect 10, wherein the at least one encapsulation layer interconnect comprises: a plurality of through mold vias (TMVs) that at least partially surround the integrated device; and a plurality of wire bonds that at least partially surround the second integrated device.

Aspect 12: The package of aspect 11, wherein the at least one metal layer and the plurality of TMVs are configured to dissipate heat from the integrated device through (i) the backside of the integrated device, (ii) the metal layer, (iii) the plurality of TMVs, and (iv) a first plurality of interconnects of the substrate, and wherein the at least one metal layer and the plurality of wire bonds are configured to dissipate heat from the integrated device through (i) the backside of the integrated device, (ii) the at least one metal layer, (iii) the plurality of wire bonds, and (iv) a second plurality of interconnects of the substrate.

Aspect 13: The package of aspect 10, wherein a majority of a heat that is generated by the integrated device and the second integrated device is dissipated by heat conduction through (i) the at least one metal layer, (ii) the at least one encapsulation layer interconnect, and (iii) the plurality of interconnects of the substrate.

Aspect 14: The package of aspects 1 through 13, wherein the integrated device includes a die, a radio frequency (RF) device, a passive device, a filter, a capacitor, an inductor, a resistor, a surface acoustic wave (SAW) filter, a bulk acoustic wave (BAW) filter, a processor, a memory, a power amplifier, a switch, a system on chip, an integrated circuit device, a MEMS device, a NEMS device and/or combinations thereof.

Aspect 15: The package of aspects 1 through 15, further comprising at least one thermal dielectric layer located between the at least one metal layer and the backside of the integrated device.

Aspect 16: The package of aspect 15, wherein the at least one thermal dielectric layer and the at least one encapsulation layer interconnect are configured to dissipate heat from the integrated device through (i) the backside of the integrated device, (ii) the at least one thermal dielectric layer, (iii) the at least one encapsulation layer interconnect, and (iv) the plurality of interconnects of the substrate.

Aspect 17: The package of aspects 15 through 16, wherein the at least one metal layer, the at least one thermal dielectric layer and the at least one encapsulation layer interconnect are configured to dissipate heat from the integrated device through (i) the backside of the integrated device, (ii) the at least one thermal dielectric layer, (iii) the at least one metal layer, (iv) the at least one encapsulation layer interconnect, and (v) the plurality of interconnects of the substrate.

Aspect 18: The package of aspect 17, wherein a majority of the heat that is generated by the integrated device is dissipated by heat conduction through (i) the backside of the integrated device, (ii) the at least one thermal dielectric layer, (iii) the at least one metal layer, (iv) the at least one encapsulation layer interconnect, and (v) the plurality of interconnects of the substrate.

Aspect 19: The package of aspects 15 through 18, wherein the at least one thermal dielectric layer is located over the encapsulation layer.

Aspect 20: The package of aspects 15 through 19, wherein the at least one thermal dielectric layer is coupled to the backside of the integrated device and the at least one encapsulation layer interconnect.

Aspect 21: The package of aspects 1 through 20, wherein the at least one metal layer is located over a side surface of the encapsulation layer and a side surface of the substrate.

Aspect 22: The package of aspects 1 through 21, wherein the at least one encapsulation layer interconnects includes a plurality of encapsulation layer interconnects that laterally surround the integrated device.

Aspect 23: An apparatus comprising a substrate, an integrated device coupled to the substrate; means for encapsulation located over the substrate; means for encapsulation layer interconnection located in the means for encapsulation, and means for electromagnetic interference (EMI) shield located over the means for encapsulation. The substrate comprising at least one dielectric layer; and a plurality of interconnects. The means for encapsulation layer interconnection is coupled to the substrate. The means for EMI shield is located over a backside of the integrated device.

Aspect 24: The apparatus of aspect 23, wherein the means for encapsulation layer interconnection includes at least one through mold via (TMV) and/or at least one wire bond.

Aspect 25: The apparatus of aspects 23 through 24, wherein the means for electromagnetic interference (EMI) shield includes at least one metal layer, and wherein the means for encapsulation layer interconnection includes at least one encapsulation layer interconnect.

Aspect 26: The apparatus of aspect 25, wherein the at least one metal layer and the at least one encapsulation layer interconnect is configured to be coupled to ground.

Aspect 27: The apparatus of aspect 25, wherein the at least one metal layer and the at least one encapsulation layer interconnect are configured to dissipate heat from the integrated device through (i) the backside of the integrated device, (ii) the at least one metal layer, (iii) the at least one encapsulation layer interconnect, and (iv) the plurality of interconnects of the substrate.

Aspect 28: The apparatus of aspect 27, wherein a majority of the heat that is generated by the integrated device is dissipated by heat conduction through (i) the backside of the integrated device, and (ii) the at least one metal layer, (iii) the at least one encapsulation layer interconnect, and (iv) the plurality of interconnects of the substrate.

Aspect 29: The apparatus of aspect 25, further comprising a second integrated device coupled to the substrate, wherein the at least one metal layer is located over a backside of the second integrated device, wherein the at least one metal layer is configured as an EMI shield for the integrated device and the second integrated device, wherein the at least one metal layer is configured to be coupled to ground, and wherein the at least one metal layer is further configured to dissipate heat away from the integrated device and the second integrated device.

Aspect 30: The apparatus of aspect 29, wherein the at least one encapsulation layer interconnect comprises: a plurality of through mold vias (TMVs) that at least partially surround the integrated device; and a plurality of wire bonds that at least partially surround the second integrated device.

Aspect 31: The apparatus of aspect 30, wherein the metal layer and the plurality of TMVs are configured to dissipate heat from the integrated device through (i) the backside of the integrated device, (ii) the at least one metal layer, (iii) the plurality of TMVs, and (iv) a first plurality of interconnects of the substrate, and wherein the at least one metal layer and the plurality of wire bonds are configured to dissipate heat from the integrated device through (i) the backside of the integrated device, (ii) the at least one metal layer, (iii) the plurality of wire bonds, and (iv) a second plurality of interconnects of the substrate.

Aspect 32: The apparatus of aspect 29, wherein a majority of a heat that is generated by the integrated device and the second integrated device is dissipated by heat conduction through (i) the at least one metal layer, (ii) the at least one encapsulation layer interconnect, and (iii) the plurality of interconnects of the substrate.

Aspect 33: The apparatus of aspects 23 through 32, wherein the integrated device includes a die, a radio frequency (RF) device, a passive device, a filter, a capacitor, an inductor, a resistor, a surface acoustic wave (SAW) filter, a bulk acoustic wave (BAW) filter, a processor, a memory, a power amplifier, a switch, a system on chip, an integrated circuit device, a MEMS device, a NEMS device and/or combinations thereof.

Aspect 34: The apparatus of aspects 23 through 33, further comprising at least one thermal dielectric layer located between the at least one metal layer and the backside of the integrated device.

Aspect 35: The apparatus of aspect 34, wherein the at least one thermal dielectric layer and the at least one encapsulation layer interconnect are configured to dissipate heat from the integrated device through (i) the backside of the integrated device, (ii) the at least one thermal dielectric layer, (iii) the at least one encapsulation layer interconnect, and (iv) the plurality of interconnects of the substrate.

Aspect 36: The apparatus of aspect 34, wherein the at least one metal layer, the at least one thermal dielectric layer and the at least one encapsulation layer interconnect are configured to dissipate heat from the integrated device through (i) the backside of the integrated device, (ii) the at least one thermal dielectric layer, (iii) the at least one metal layer, (iv)

the at least one encapsulation layer interconnect, and (v) the plurality of interconnects of the substrate.

Aspect 37: The apparatus of aspect 36, wherein a majority of the heat that is generated by the integrated device is dissipated by heat conduction through (i) the backside of the integrated device, (ii) the at least one thermal dielectric layer, (iii) the at least one metal layer, (iv) the at least one encapsulation layer interconnect, and (v) the plurality of interconnects of the substrate.

Aspect 38: The apparatus of aspect 34, wherein the at least one thermal dielectric layer is located over the means for encapsulation.

Aspect 39: The apparatus of aspect 34, wherein the at least one thermal dielectric layer is coupled to the backside of the integrated device and the at least one encapsulation layer interconnect.

Aspect 40: The apparatus of aspects 23 through 39, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 41: A package comprising a substrate, an integrated device coupled to the substrate; an encapsulation layer located over the substrate; at least one encapsulation layer interconnect located in the encapsulation layer, wherein the at least one encapsulation layer interconnect is coupled to the substrate; and at least one thermal dielectric layer located over the encapsulation layer, wherein the at least one thermal dielectric layer is located over a backside of the integrated device. The substrate comprising at least one dielectric layer; and a plurality of interconnects.

Aspect 42: The package of aspect 41, wherein the at least one thermal dielectric layer and the at least one encapsulation layer interconnect are configured to dissipate heat from the integrated device through (i) the backside of the integrated device, (ii) the at least one thermal dielectric layer, (iii) the at least one encapsulation layer interconnect, and (iv) the plurality of interconnects of the substrate.

Aspect 43: The package of aspects 41 through 42, wherein the at least one thermal dielectric layer includes a trench located over at least one encapsulation layer interconnect.

Aspect 44: The package of aspects 41 through 43, wherein the at least one encapsulation layer interconnect includes a though mold via (TMV), a wire bond, a metallized frame, and/or a surface mounted device (SMD).

Aspect 45: The package of aspects 41 through 44, wherein the package includes a plurality of integrated devices coupled to the substrate.

Aspect 46: A method for fabricating a package. The method provides a substrate comprising at least one dielectric layer; and a plurality of interconnects. The method couples an integrated device to the substrate. The method forms an encapsulation layer located over the substrate. The method forms at least one encapsulation layer interconnect located in the encapsulation layer, wherein the encapsulation layer interconnect is coupled to the substrate. The method forms at least one metal layer over the encapsulation layer. The at least one metal layer is configured as an electromagnetic interference (EMI) shield for the package. The at least one metal layer is located over a backside of the integrated device.

Aspect 47: The method of aspect 46, wherein the at least one metal layer is configured as a conformal EMI shield for the package, wherein the at least one encapsulation layer interconnect is configured as a compartmental EMI shield for the package.

Aspect 48: The method of aspects 46 through 47, wherein forming the at least one encapsulation layer interconnect includes forming a through mold via (TMV) in the encapsulation layer and/or forming at least one wire bond.

Aspect 49: The method of aspects 46 through 48, further comprising forming at least one thermal dielectric layer over the backside of the integrated device, wherein forming the at least one metal layer includes forming the at least one metal layer over the at least one thermal dielectric layer.

Aspect 50: The method of aspect 49, further comprising forming at least one thermal dielectric layer over the encapsulation layer, wherein the at least one thermal dielectric layer is coupled to the at least one encapsulation layer interconnect.

Aspect 51: A package comprising a substrate; an integrated device coupled to the substrate; an encapsulation layer located over the substrate; at least one encapsulation layer interconnect located in the encapsulation layer, wherein the at least one encapsulation layer interconnect is coupled to the substrate; and at least one dielectricum layer located over the encapsulation layer, wherein the at least one dielectricum layer is located over a backside of the integrated device. The substrate comprising at least one dielectric layer; and a plurality of interconnects.

Aspect 52: The package of aspect 51, wherein the at least one dielectricum layer is configured as a thermal management layer for the package, and wherein the encapsulation layer interconnect is configured as a compartmental EMI shield for the package.

Aspect 53: The package of aspects 51 through 52, wherein the at least one encapsulation layer interconnect includes at least one through mold via (TMV) and/or at least one wire bond.

Aspect 54: The package of aspects 51 through 53, wherein the at least one dielectricum layer and the at least one encapsulation layer interconnect are configured to be coupled to ground.

Aspect 55: The package of aspects 51 through 54, wherein the at least one dielectricum layer and the at least one encapsulation layer interconnect are configured to dissipate heat from the integrated device through (i) the backside of the integrated device, (ii) the at least one dielectricum layer, (iii) the at least one encapsulation layer interconnect, and (iv) the plurality of interconnects of the substrate.

Aspect 56: The package of aspect 55, wherein a majority of the heat that is generated by the integrated device is dissipated by heat conduction through (i) the backside of the integrated device, and (ii) the at least one dielectricum layer, (iii) the at least one encapsulation layer interconnect, and (iv) the plurality of interconnects of the substrate.

Aspect 57: The package of aspects 51 through 56, wherein the package includes a plurality of integrated devices coupled to the substrate.

Aspect 58: A method for fabricating a package. The method provides a substrate comprising at least one dielectric layer; and a plurality of interconnects. The method couples an integrated device to the substrate. The method forms an encapsulation layer located over the substrate. The method forms at least one encapsulation layer interconnect located in the encapsulation layer, wherein the encapsulation layer interconnect is coupled to the substrate. The method forms at least one dielectricum layer over the encapsulation layer. The at least one dielectricum layer is located over a backside of the integrated device.

Aspect 59: The method of aspect 58, wherein forming the at least one encapsulation layer interconnect includes forming a through mold via (TMV) in the encapsulation layer and/or forming at least one wire bond.

Aspect 60: A method for fabricating a package. The method provides a substrate comprising at least one dielectric layer; and a plurality of interconnects. The method couples an integrated device to the substrate. The method forms an encapsulation layer located over the substrate. The method forms at least one encapsulation layer interconnect located in the encapsulation layer, wherein the encapsulation layer interconnect is coupled to the substrate. The method forms at least one thermal dielectric layer over the encapsulation layer. The at least one thermal dielectric layer is located over a backside of the integrated device.

Aspect 61: The method of aspect 60, wherein forming the at least one encapsulation layer interconnect includes forming a through mold via (TMV) in the encapsulation layer and/or forming at least one wire bond.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
   a substrate comprising:
   at least one dielectric layer; and
   a plurality of interconnects;
   an integrated device coupled to the substrate through at least a plurality of solder interconnects;
   an encapsulation layer located over the substrate;
   at least one encapsulation layer interconnect located in the encapsulation layer,
      wherein the at least one encapsulation layer interconnect is coupled to the substrate,
      wherein the at least one encapsulation layer interconnect comprises at least one wire bond coupled to and touching the at least one metal layer and the substrate, and
      wherein a top surface of the at least one wire bond is planar to a surface of the backside of the integrated device; and
   at least one metal layer coupled to the encapsulation layer and coupled to a backside of the integrated device,
   wherein the at least one metal layer touches the backside of the integrated device, and
   wherein the at least one metal layer is configured as an electromagnetic interference (EMI) shield for the package.

2. The package of claim 1, wherein the package includes a plurality of integrated devices coupled to the substrate.

3. The package of claim 1, wherein the at least one metal layer and the at least one encapsulation layer interconnect are configured to be coupled to ground.

4. The package of claim 1, wherein the at least one metal layer and the at least one encapsulation layer interconnect are configured to dissipate heat from the integrated device through (i) the backside of the integrated device, (ii) the at least one metal layer, (iii) the at least one encapsulation layer interconnect, and (iv) the plurality of interconnects of the substrate.

5. The package of claim 4, wherein a majority of the heat that is generated by the integrated device is dissipated by heat conduction through (i) the backside of the integrated device, and (ii) the at least one metal layer, (iii) the at least one encapsulation layer interconnect, and (iv) the plurality of interconnects of the substrate.

6. The package of claim 4, wherein at least twenty percent (20%) of the heat that is generated by the integrated device is dissipated by heat conduction through (i) the backside of the integrated device, and (ii) the at least one metal layer, (iii) the at least one encapsulation layer interconnect, and (iv) the plurality of interconnects of the substrate.

7. The package of claim 1, further comprising a second integrated device coupled to the substrate,
   wherein the at least one metal layer is located over a backside of the second integrated device,
   wherein the at least one metal layer is configured as an EMI shield for the integrated device and the second integrated device,
   wherein the at least one metal layer is configured to be coupled to ground, and
   wherein the at least one metal layer is further configured to dissipate heat away from the integrated device and the second integrated device.

8. The package of claim 7, wherein the at least one encapsulation layer interconnect comprises:
   a plurality of through mold vias (TMVs) that at least partially surround the integrated device; and
   a plurality of wire bonds that at least partially surround the second integrated device.

9. The package of claim 8,
   wherein the at least one metal layer and the plurality of TMVs are configured to dissipate heat from the integrated device through (i) the backside of the integrated device, (ii) the metal layer, (iii) the plurality of TMVs, and (iv) a first plurality of interconnects of the substrate, and
   wherein the at least one metal layer and the plurality of wire bonds are configured to dissipate heat from the integrated device through (i) the backside of the integrated device, (ii) the at least one metal layer, (iii) the plurality of wire bonds, and (iv) a second plurality of interconnects of the substrate.

10. The package of claim 7, wherein at least twenty percent (20%) of the heat that is generated by the integrated device and the second integrated device is dissipated by heat conduction through (i) the at least one metal layer, (ii) the at least one encapsulation layer interconnect, and (iii) the plurality of interconnects of the substrate.

11. The package of claim 1, wherein the integrated device includes a die, a radio frequency (RF) device, a passive device, a filter, a capacitor, an inductor, a resistor, a surface acoustic wave (SAW) filter, a bulk acoustic wave (BAW) filter, a processor, a memory, a power amplifier, a switch, a system on chip, an integrated circuit device, a MEMS device, a NEMS device and/or combinations thereof.

12. The package of claim 1, wherein the at least one metal layer is further coupled to a side surface of the substrate.

13. The package of claim 1, wherein the at least one encapsulation layer interconnects includes a plurality of encapsulation layer interconnects that laterally surround the integrated device.

14. A package comprising:
   a substrate comprising:
   at least one dielectric layer; and
   a plurality of interconnects;
   an integrated device coupled to the substrate;

an encapsulation layer located over the substrate;
at least one encapsulation layer interconnect located in the encapsulation layer, wherein the at least one encapsulation layer interconnect is coupled to the substrate; and
at least one metal layer coupled to the encapsulation layer and coupled to a backside of the integrated device, wherein the at least one metal layer is configured as an electromagnetic interference (EMI) shield for the package,
wherein the integrated device is coupled to the substrate through a plurality of pillar interconnects and a plurality of solder interconnects,
wherein the backside of the integrated device touches the at least one metal layer,
wherein the at least one metal layer is configured as a conformal EMI shield for the package,
wherein the at least one encapsulation layer interconnect includes at least one wire bond coupled to the plurality of interconnects of the substrate,
wherein a top surface of the at least one wire bond is planar to a surface of the backside of the integrated device, and
wherein the at least one wire bond is configured as a compartmental EMI shield for the package.

15. The package of claim 14, wherein the at least one encapsulation layer interconnect further includes at least one through mold via (TMV).

16. The package of claim 15, wherein the at least one through mold via (TMV) and/or the at least one wire bond is coupled to the plurality of interconnects of the substrate.

17. The package of claim 14, further comprising at least one thermal dielectric layer located between the at least one metal layer and the backside of the integrated device, wherein the at least one wire bond is coupled to the metal layer through the at least one thermal dielectric layer.

18. The package of claim 17, wherein the at least one thermal dielectric layer and the at least one encapsulation layer interconnect are configured to dissipate heat from the integrated device through (i) the backside of the integrated device, (ii) the at least one thermal dielectric layer, (iii) the at least one encapsulation layer interconnect, and (iv) the plurality of interconnects of the substrate.

19. The package of claim 17,
wherein the at least one metal layer, the at least one thermal dielectric layer and the at least one encapsulation layer interconnect are configured to dissipate heat from the integrated device through (i) the backside of the integrated device, (ii) the at least one thermal dielectric layer, (iii) the at least one metal layer, (iv) the at least one encapsulation layer interconnect, and (v) the plurality of interconnects of the substrate, and
wherein a majority of the heat that is generated by the integrated device is dissipated by heat conduction through (i) the backside of the integrated device, (ii) the at least one thermal dielectric layer, (iii) the at least one metal layer, (iv) the at least one encapsulation layer interconnect, and (v) the plurality of interconnects of the substrate.

20. The package of claim 17,
wherein the at least one thermal dielectric layer is located over the encapsulation layer, and
wherein the at least one thermal dielectric layer is coupled to the backside of the integrated device and the at least one encapsulation layer interconnect.

21. An apparatus comprising:
a substrate comprising:
at least one dielectric layer; and
a plurality of interconnects;
an integrated device coupled to the substrate through at least a plurality of solder interconnects;
means for encapsulation located over the substrate;
means for encapsulation layer interconnection located in the means for encapsulation, wherein the means for encapsulation layer interconnection is coupled to the substrate, wherein the means for encapsulation layer interconnection comprises at least one wire bond coupled to the substrate; and
means for electromagnetic interference (EMI) shield coupled to the means for encapsulation, wherein the means for EMI shield is located over and coupled to a backside of the integrated device,
wherein the means for EMI shield touches the backside of the integrated device and the at least one wire bond, and
wherein a top surface of the at least one wire bond is planar to a surface of the backside of the integrated device.

22. The apparatus of claim 21, wherein the means for encapsulation layer interconnection further includes at least one through mold via (TMV).

23. The apparatus of claim 21,
wherein the means for electromagnetic interference (EMI) shield includes at least one metal layer coupled to the backside of the integrated device,
wherein the means for encapsulation layer interconnection includes at least one encapsulation layer interconnect, and
wherein the at least one wire bond is coupled to the plurality of interconnects of the substrate.

24. The apparatus of claim 23, wherein the at least one metal layer and the at least one encapsulation layer interconnect are configured to be coupled to ground.

25. The apparatus of claim 23, wherein the at least one metal layer and the at least one encapsulation layer interconnect are configured to dissipate heat from the integrated device through (i) the backside of the integrated device, (ii) the at least one metal layer, (iii) the at least one encapsulation layer interconnect, and (iv) the plurality of interconnects of the substrate.

26. The apparatus of claim 25, wherein a majority of the heat that is generated by the integrated device is dissipated by heat conduction through (i) the backside of the integrated device, and (ii) the at least one metal layer, (iii) the at least one encapsulation layer interconnect, and (iv) the plurality of interconnects of the substrate.

27. The apparatus of claim 23, further comprising at least one thermal dielectric layer located between the at least one metal layer and the backside of the integrated device.

28. The apparatus of claim 27, wherein the at least one thermal dielectric layer and the at least one encapsulation layer interconnect are configured to dissipate heat from the integrated device through (i) the backside of the integrated device, (ii) the at least one thermal dielectric layer, (iii) the at least one encapsulation layer interconnect, and (iv) the plurality of interconnects of the substrate.

29. The apparatus of claim 27, wherein the at least one metal layer, the at least one thermal dielectric layer and the at least one encapsulation layer interconnect are configured to dissipate heat from the integrated device through (i) the backside of the integrated device, (ii) the at least one thermal dielectric layer, (iii) the at least one metal layer, (iv) the at least one encapsulation layer interconnect, and (v) the plurality of interconnects of the substrate.

30. The apparatus of claim 29, wherein at least twenty percent (20%) of the heat that is generated by the integrated device is dissipated by heat conduction through (i) the backside of the integrated device, (ii) the at least one thermal dielectric layer, (iii) the at least one metal layer, (iv) the at least one encapsulation layer interconnect, and (v) the plurality of interconnects of the substrate.

31. The apparatus of claim 23, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

32. A method for fabricating a package, comprising:
   providing a substrate comprising:
      at least one dielectric layer; and
      a plurality of interconnects;
   coupling an integrated device to the substrate through at least a plurality of solder interconnects;
   forming an encapsulation layer located over the substrate;
   forming at least one encapsulation layer interconnect located in the encapsulation layer, wherein the encapsulation layer interconnect is coupled to the substrate, wherein forming at least one encapsulation layer interconnect comprises forming at least one wire bond coupled to the substrate; and
   forming at least one metal layer that is coupled to the encapsulation layer and coupled to a backside of the integrated device, wherein the at least one metal layer is further coupled to the at least one metal layer,
   wherein the at least one metal layer touches the backside of the integrated device,
   wherein a top surface of the at least one wire bond is planar to a surface of the backside of the integrated device, and
   wherein the at least one metal layer is configured as an electromagnetic interference (EMI) shield for the package.

33. The method of claim 32,
   wherein the at least one metal layer is configured as a conformal EMI shield for the package, and
   wherein the at least one encapsulation layer interconnect is configured as a compartmental EMI shield for the package.

34. The method of claim 32, wherein forming the at least one encapsulation layer interconnect includes forming a through mold via (TMV) in the encapsulation layer and/or forming at least one wire bond.

35. The method of claim 32, further comprising forming at least one thermal dielectric layer over the backside of the integrated device, wherein forming the at least one metal layer includes forming the at least one metal layer over the at least one thermal dielectric layer.

36. The method of claim 35, further comprising forming at least one thermal dielectric layer over the encapsulation layer, wherein the at least one thermal dielectric layer is coupled to the at least one encapsulation layer interconnect.

* * * * *